(12) United States Patent
Xu

(10) Patent No.: US 11,695,425 B2
(45) Date of Patent: *Jul. 4, 2023

(54) ADC SLICER RECONFIGURATION FOR DIFFERENT CHANNEL INSERTION LOSS

(71) Applicant: eTopus Technology Inc., San Jose, CA (US)

(72) Inventor: Danfeng Xu, Cupertino, CA (US)

(73) Assignee: eTopus Technology Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/952,079

(22) Filed: Sep. 23, 2022

(65) Prior Publication Data

US 2023/0020651 A1 Jan. 19, 2023

Related U.S. Application Data

(63) Continuation of application No. 17/397,303, filed on Aug. 9, 2021, now Pat. No. 11,489,540, which is a continuation of application No. 17/086,905, filed on Nov. 2, 2020, now Pat. No. 11,115,040.

(51) Int. Cl.
  *H03M 1/38* (2006.01)
  *H04B 1/16* (2006.01)
  *H03M 1/12* (2006.01)

(52) U.S. Cl.
  CPC .............. *H03M 1/38* (2013.01); *H03M 1/121* (2013.01); *H03M 1/1245* (2013.01); *H04B 1/16* (2013.01)

(58) Field of Classification Search
  CPC ......... H03M 1/21; H03M 1/1245; H03M 1/38

USPC ................. 341/155, 141, 122, 138
See application file for complete search history.

(56) References Cited

U.S. PATENT DOCUMENTS

| | | | |
|---|---|---|---|
| 8,659,462 B2 | 2/2014 | Kang | |
| 8,798,219 B2 | 8/2014 | Buchwald et al. | |
| 8,902,094 B1 | 12/2014 | Zhang et al. | |
| 9,270,291 B1 | 2/2016 | Parnaby et al. | |
| 9,319,249 B2 | 4/2016 | Chan et al. | |
| 9,455,737 B1 | 9/2016 | Rajaee et al. | |
| 9,503,115 B1 | 11/2016 | Shin et al. | |
| 9,602,116 B1 | 3/2017 | Le et al. | |

(Continued)

FOREIGN PATENT DOCUMENTS

| | | |
|---|---|---|
| CN | 102571094 A | 7/2012 |
| CN | 105075123 A | 11/2015 |

(Continued)

OTHER PUBLICATIONS

First Office Action, China National Intellectual Property Administration Patent Application No. 202010692323.7, dated Apr. 6, 2021, 14 pages.

(Continued)

*Primary Examiner* — Peguy Jean Pierre
(74) *Attorney, Agent, or Firm* — Fenwick & West LLP

(57) ABSTRACT

A receiver having analog-to-digital converters (ADC) is disclosed. The ADCs may be reconfigured based on the insertion loss mode of the receiver. For example, different portions of a plurality of time-interleaved successive approximation (SAR) ADC slices included in at least one sub-ADC of each time-interleaved ADC may be enabled depending on which of a plurality of insertion loss modes is selected for operation of the receiver.

20 Claims, 24 Drawing Sheets

(56) References Cited

U.S. PATENT DOCUMENTS

| | | |
|---|---|---|
| 10,270,627 B2 | 4/2019 | Chan et al. |
| 10,680,857 B2 | 6/2020 | Chan et al. |
| 10,720,934 B1 | 7/2020 | Braswell et al. |
| 10,720,936 B1 | 7/2020 | Xu |
| 10,931,295 B2 | 2/2021 | Xu |
| 11,115,040 B1 * | 9/2021 | Xu ................ H03M 1/1215 |
| 11,349,689 B2 | 5/2022 | Chan et al. |
| 11,489,540 B2 * | 11/2022 | Xu ................ H03M 1/1215 |
| 2012/0146822 A1 | 6/2012 | Kang |
| 2013/0163701 A1 | 6/2013 | Buchwald et al. |
| 2014/0091958 A1 | 4/2014 | Cowley et al. |
| 2015/0263753 A1 | 9/2015 | Ramakrishnan et al. |
| 2015/0381195 A1 | 12/2015 | Sundblad et al. |
| 2016/0048707 A1 | 2/2016 | Alladi et al. |
| 2016/0065396 A1 | 3/2016 | Chan et al. |
| 2016/0197702 A1 | 7/2016 | Chan et al. |
| 2017/0201267 A1 | 7/2017 | Le et al. |
| 2019/0207787 A1 | 7/2019 | Chan et al. |
| 2020/0259684 A1 | 8/2020 | Chan et al. |

FOREIGN PATENT DOCUMENTS

| | | |
|---|---|---|
| CN | 105144587 A | 12/2015 |
| CN | 106688200 A | 5/2017 |
| CN | 108141223 A | 6/2018 |

OTHER PUBLICATIONS

First Office Action, China National Intellectual Property Adminstration Patent Application No. 202111273002.4, dated Jun. 23, 2022, 12 pages.

Kull, L. et al., "A 24-to-72GS/s 8b Time-Interleaved SAR ADC with 2.0-to-3.3pJ/conversion and >30dB SNDR at Nyquist in 14nm CMOS FinFET," 2018 IEEE International Solid-State Circuits Conference, Feb. 14, 2018, pp. 358-359.

Search Report, China National Intellectual Property Administration Patent Application No. 202010692323.7, dated Jun. 10, 2021, 4 pages.

United States Office Action, U.S. Appl. No. 16/518,504, dated Feb. 5, 2020, 11 pages.

United States Office Action, U.S. Appl. No. 16/902,919, dated Aug. 19, 2020, 10 pages.

United States Office Action, U.S. Appl. No. 17/150,644, dated Jul. 6, 2021, 7 pages.

Upadhyaya, P. et al., "A Fully Adaptive 19-to-56Gb/s PAM-4 Wireline Transceiver with a Configurable ADC in 16nm FinFET," 2018 IEEE International Solid-State Circuits Conference, Feb. 12, 2018, pp. 108-109.

Wang, L. et al., "A 64Gb/s PAM-4 Transceiver Utilizing an Adaptive Threshold ADC in 16nm FinFET," 2018 IEEE International Solid-State Circuits Conference, Feb. 12, 2018, pp. 110-112.

Chinese Office Action, China National Intellectual Property Administration Patent Application No. 202211396285.6, dated Apr. 1, 2023, 13 pages.

\* cited by examiner

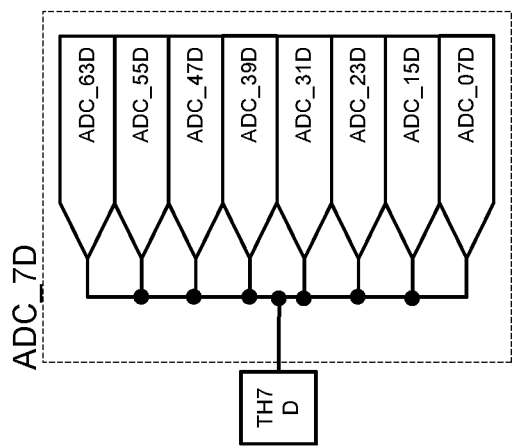

ADC SLICER RECONFIGURATION FOR DIFFERENT CHANNEL INSERTION LOSS

CROSS-REFERENCE TO RELATED APPLICATION

This application is a continuation of U.S. patent application Ser. No. 17/397,303 filed on Aug. 9, 2021, which is a continuation of U.S. patent application Ser. No. 17/086,905 filed on Nov. 2, 2020, now U.S. Pat. No. 11,115,040, each of which is incorporated by reference in its entirety.

BACKGROUND

1. Field of Art

The disclosure generally relates to a receiver device, more specifically to a receiver device including a reconfigurable analog-to-digital converter (ADC) based on an insertion loss mode of the receiver.

2. Description of the Related Art

High speed communication systems transfer data over communication links at high data rates (e.g., 10 GS/s and beyond). Receiving devices in high speed communications systems can include analog-to-digital converters to convert the received analog signals into digital form for digital signal processing. As signaling speeds increase, the sampling rate of analog-to-digital converters included in the receiving devices will continue to increase as well as power consumption in order for the receiving devices to recover data from the analog signals.

SUMMARY

Embodiments of the present disclosure include a receiver having time-interleaved analog-to-digital converters (ADC). Each ADC may include a plurality of sub-ADCs where each sub-ADC includes a plurality of time-interleaved successive approximation (SAR) ADC slices.

In one embodiment, the receiver may be configured to operate under different insertion loss modes where each insertion loss mode is associated with a corresponding insertion loss. The insertion loss for each insertion loss mode is based on the type of communication that the receiver is being used for in the particular insertion loss mode. For example, higher insertion loss is acceptable for long range communication whereas lower insertion loss is acceptable for short range communication.

Depending on the configured insertion loss mode of the receiver, different sets of SAR ADC slices for sub-ADCs of each time-interleaved ADC may be enabled. For example, more of the SAR ADC slicers of each sub-ADC may be used for a mode of the receiver with the most amount of channel insertion loss and fewer of the ADC slicers of each sub-ADC may be used for a mode of the receiver with the least amount of channel insertion loss.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes only, and may not have been selected to delineate or circumscribe the inventive subject matter.

BRIEF DESCRIPTION OF DRAWINGS

The disclosed embodiments have advantages and features that will be more readily apparent from the detailed description, the appended claims, and the accompanying figures (or drawings). A brief introduction of the figures is below.

FIG. 2B is a detailed block diagram of a sub-ADC, according to an embodiment.

DETAILED DESCRIPTION

The Figures (FIGS.) and the following description relate to embodiments by way of illustration only. It should be noted that from the following discussion, alternative embodiments of the structures and methods disclosed herein will be readily recognized as viable alternatives that may be employed without departing from the principles of what is claimed. Reference will now be made in detail to several embodiments, examples of which are illustrated in the accompanying figures. It is noted that wherever practicable similar or like reference numbers may be used in the figures and may indicate similar or like functionality.

Receiver Architecture

Figure 1:
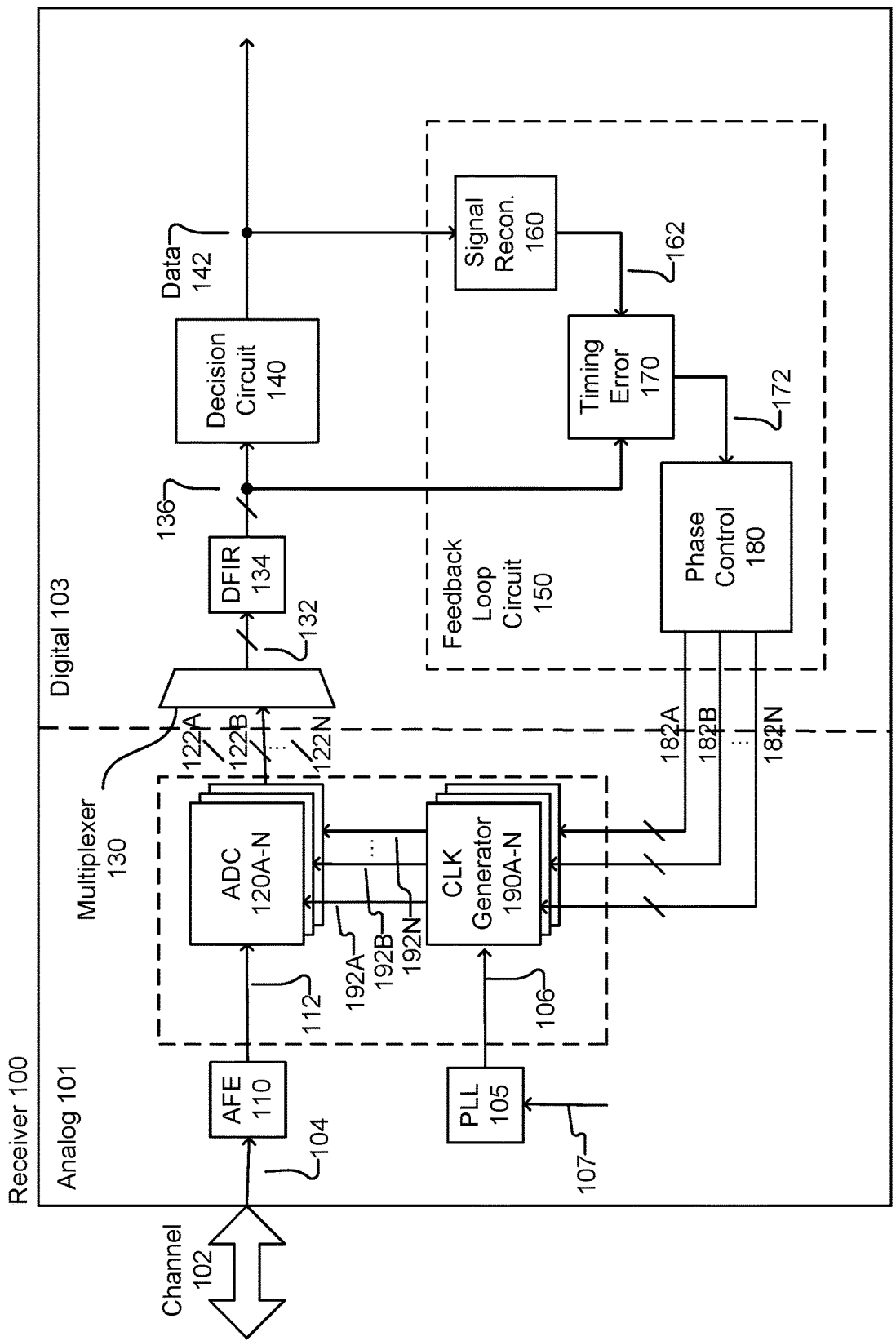
FIG. 1 is a high-speed communication system that includes a receiver, according to an embodiment.

FIG. 1 is a high-speed communication system that includes a receiver 100, according to one embodiment. The receiver 100 includes an analog portion 101 and a digital portion 103. The analog portion 101 of the receiver 100 is coupled to a communications channel 102 and receives an analog channel signal 104 from a remote transmitter (not shown) through the communications channel 102. The communications channel 102 can be, for example, an electrical communication channel found in a computing backplane that carries single ended or differential signals. The communications channel 102 can also be, for example, an optical communication channel.

The analog channel signal 104 is generated at the transmitter from digital data. The receiver 100 recovers digital data 142 from the channel signal 104 at the digital portion 103 of the receiver 100. In some embodiments, the receiver 100 can be a standalone device or part of a larger device, such as an application specific integrated circuit (ASIC). The analog portion 101 of the receiver 100 includes an analog front end (AFE) 110, analog to digital converters (ADCs) 120A-N, PLL (phase locked loop) 105, and clock generators 190A-N. The digital portion 103 of the receiver 100 includes multiplexer 130, a digital finite impulse response (DFIR) filter 134, a data decision circuit 140, and a feedback loop circuit 150. The feedback loop circuit 150 includes a signal reconstruction circuit 160, a timing error circuit 170 and a phase control circuit 180. Each of these components can be implemented with hardware circuits that generate signals, and the lines connecting the components carry signals from one component to the next.

The AFE 110 performs pre-processing on the received channel signal 104 using analog processing techniques to generate an analog input signal 112. The channel signal 104 can be non-ideal due to channel impairments, such as insertion loss, crosstalk, inter symbol interference and optical dispersion, and the AFE 210 uses analog processing to reduce some of these non-idealities. Examples of analog processing techniques include gain adjustment or continuous time equalization filters. In other embodiments, the AFE 110 can simply be an input terminal that receives the channel signal 104 and passes it on to generate the analog input signal 212 with no signal processing.

The input of the ADCs 120A-N is coupled to the output of AFE 110. Each ADC 120 converts analog input signal 112 into digital input samples 122 by sampling the analog input signal 112 and then rounding or quantizing the sampled input signal 112 to its closest digital value. Each digital value represents a different voltage level of the sampled input signal 112. Each ADC 120 outputs an M bit digital code in binary form.

The sampling phase of each ADC 120 is controlled by its own sampling clock signal 192. For example, ADC 120A generates samples 122A at a phase of sampling clock signal 192A, and ADC 120B generates samples 122B at a phase of sampling clock signal 192B, and so on. Each of the sampling clocks signals 192A-N has different phases from one another, which causes each corresponding ADC 120 to sample the analog input signal 112 at a different phase.

The multiplexer 130 receives the digital input samples 122A-N from the ADCs 120A-N and selects one digital input sample 122A-N at a time for its output. The multiplexer 130 selects between the digital input samples 122A-N in round robin manner such that all the digital input samples 122A-N are interleaved together to form a continuous stream of digital samples. The stream of digital samples is output via digital input signals 132.

DFIR filter 134 receives the digital input signals 132 that is indicative of the digital samples and filters the digital input signals 132 into filtered digital input signals 136. The DFIR filter 134 is a filter whose impulse response has finite duration. The DFIR filter 134 produces filtered digital input signals 136 having values that are equal to a weighted sum of the delayed samples indicated by digital input signals 132. The DFIR filter 134 can include a number of taps, where each tap represents a different delayed sample. Each tap is weighted and summed together to produce the filtered digital input signals 136. The number of taps and weights can vary depending on the tuning needs of the receiver 100.

The decision circuit 140 receives the filtered digital input signals 136 and makes a data decision on the logical data value represented by the digital samples of the filtered digital input signals 136, thereby recovering data 142. The recovered data 142 can be a single-bit data (e.g., NRZ) or multi-bit data (e.g., PAM-4). In one embodiment, the data decision circuit 140 includes a digital comparator that compares each value of filtered digital input signals 136 to a threshold value and uses the result of the comparison as the recovered data 142. In one embodiment, the data decision circuit 140 is a digital signal processor (DSP) that recovers data 142 from the filtered digital input signals 136 using digital signal processing algorithms. Examples of the data decision circuit 140 include adaptive equalizers, decision feedback equalizers (DFE) and maximum likelihood sequence detector (MLSD) (e.g., a Viterbi decoder). The data decision circuit 140 can also be referred to as a data recovery circuit.

The feedback loop circuit 150 is coupled to the outputs of the DFIR 134 and the data decision circuit 140. The feedback loop circuit 150 receives the filtered digital input signals 136 and the recovered data 142, and generates digital phase control signals 182A-N using these two inputs. At high speed signaling, the sampling phases of ADCs 120A-N can have a substantial effect on the accuracy of the data 142 recovered by the receiver 100. The feedback loop circuit 150 generates the digital phase control signals 182 through continuous and interlocking feedback to ensure that the phase of the sampling clock signals 192A-N is correct. As previously mentioned, the feedback loop circuit 150 can include the signal reconstruction circuit 160, the timing error circuit 170 and the phase control circuit 180.

The signal reconstruction circuit 160 receives the recovered data 142 and generates reconstructed digital input signals 162 from the recovered data 142. The reconstructed input signals 162 are a reconstructed and ideal version of the filtered digital input signals 136. In other words, the reconstructed input signals 162 represent ideal samples that are expected to be input to data decision circuit 140 if the sampling phase of the ADC 120 were ideal. If the phase of sampling clock signal 192 were at its ideal phase and resulted in ideal samples, the reconstructed input signals 162 would match exactly with the filtered digital input signals 136. However, when the phase of sampling clock signal 192 is not at the ideal phase, the reconstructed input signals 162 will be different than the filtered digital input signals 136.

Reconstructed input signals 162 can also be referred to as reference signals or target signals.

The timing error detector 170 receives the filtered digital input signals 136 and the reconstructed input signals 162 and determines if there is a difference between the two types of signals. Timing error detector 170 generates digital timing error signals 172 that indicate the presence of and degree of timing error in sampling of the analog input signal 112. The timing error signals 172 can include a series of timing error values where each timing error value represents the timing error associated with the sampling phase of a particular ADC 120.

In one embodiment, timing error detector 170 is a type of minimum mean square error (MMSE) detector. The MMSE detector determines a mean square error (MES) between the filtered digital input signals 136 and the reconstructed input signals 162. The MMSE detector then computes a gradient (i.e., slope) of the MSE over time and outputs timing error signals 172 that are indicative of a gradient of the MSE relative to a phase timing error. The gradient represents a direction in which the MSE is moving and how fast the MSE is moving in that direction.

The phase control circuit 180 receives and processes the timing error signals 172 to generate the digital phase control signals 182A-N. Each of the digital phase control signals 182A-N includes a phase control value representing a target phase of a respective sampling clock signals 192A-N. The phase control circuit 180 includes interlocking feedback paths (not shown) that use one of the digital phase control signals 182N in generating the other digital phase control signals 182A-M. The interlocking paths enable digital phase control signals 182A-N to settle to their proper values within a short amount of time. In one embodiment, the phase control circuit 180 also generates a clock skew calibration signal 211 that corrects skew in the sampling clock signals, as further described below.

A phase-locked loop 105 generates a locked clock signal 106 input to the CLK generator 190A-N. The phase locked loop 105 generates the locked clock signal 106 based on a reference clock signal 107 received from an oscillator (not shown). The phase locked loop 105 may lock the reference clock signal 107 to a desired frequency (e.g., 28 GHz) and output to the clock generators 190A-N.

The clock generators 190A-N generate the sampling clock signals 192A-N based on the digital phase control signals 182A-N and the locked clock signal 106. Specifically, the clock generators 190A-N adjust a phase of the sampling clock signals 192A-N in accordance with the phase control values of the digital phase control signals 182A-N. In one embodiment, the clock generators 190A-N are phase interpolators that move the pulses of the sampling clock signals 192A-N forward or backwards in time. For example, if digital phase control signal 182A changes values from "7" to "8," the clock generator 190A can move the pulses of the sampling clock signal 192A in a direction that increases a phase delay of the sampling clock signal 192A. The phase of the sampling clock signals 192A-N is adjusted to reach a steady state during which the filtered timing error signals 172 have a mean value of zero.

Clock Generator Architecture

Figure 2A:
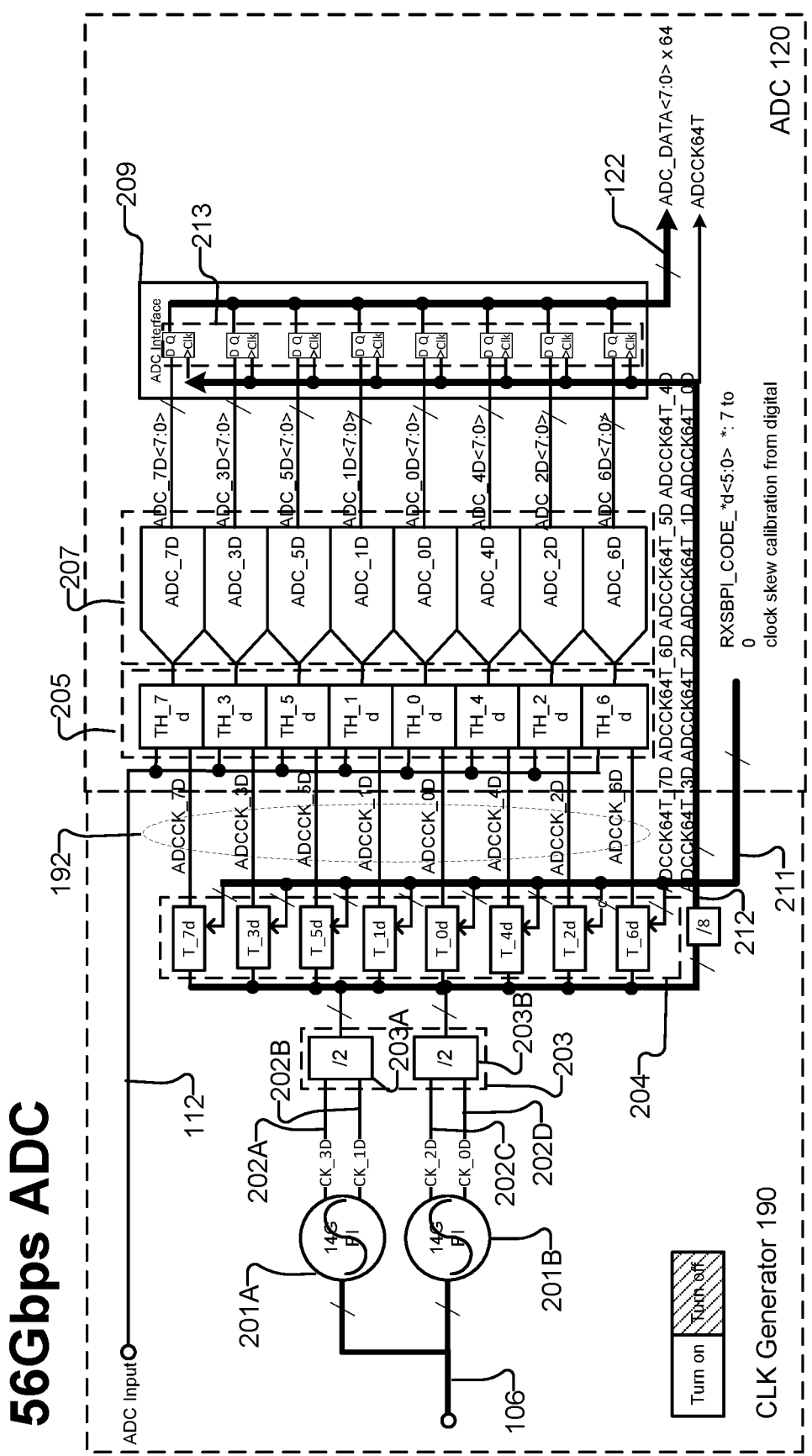
FIG. 2A is a detailed block diagram of an analog-to-digital converter (ADC) and clock generator in the receiver of FIG. 1 operating at a first data rate, according to an embodiment.

FIG. 2A is a detailed block diagram of the ADC 120 and clock generator 190 in the receiver 100, according to a first embodiment. As shown in FIG. 2A, the clock generator 190 includes circuitry for generating the sampling clock signal 192. In one embodiment, the circuitry of the clock generator 190 includes a plurality of phase interpolators 201, a clock divider 203, and a clock delay 204. Note in other embodiments, the clock generator 190 can have different components other than those shown in FIG. 2A.

In one embodiment, the phase interpolators 201 include phase interpolator 201A and phase interpolator 201B having inputs that receive the locked clock signal 106 generated by the phase-locked loop 105. The locked clock signal 106 received by the phase interpolators 201 is a reference clock signal used by the phase interpolators 201 and clock divider 203 to generate the sampling clock signal 192. The phase interpolators 210 may be 14G phase interpolators, for example. Although only two phase interpolators are shown in FIG. 2A, the clock generator 190 may have any number of phase interpolators.

Each phase interpolator 201 generates a plurality of clock signals (e.g., two clock signals) from the locked clock signal 106. In one embodiment, the clock signals generated by both phase interpolators 201A, 201B have the same frequency. For example, the clock signals generated by the phase interpolators 201A, 201B are 14 GHz clock signals.

While the clock signals generated by the phase interpolators 201 are the same frequency, the plurality of clock signals have different phases. For example, phase interpolator 201A generates clock signal 202A with a 270-degree phase shift and clock signal 202B with a 90-degree phase shift, and phase interpolator 201B generates clock signal 202C with a 180-degree phase shift and clock signal 202D with a 0-degree phase shift. Each 90-degree phase shift of the 14 GHz clock signals generated by the phase interpolators 201 represent 1 UI. In one embodiment, 1 UI refers to baud rate. For example, the baud rate of 56G PAM4 is 28G so 1 UI of 56G PAM4 is 90 degrees of 14G. The baud rate of 28 GHZ is 28G so 1 UI is still 90 degrees of 14G.

In one embodiment, the clock divider 203 comprises a plurality of clock divider circuits 203. The clock divider 203 further divides the clocks signals generated by the phase interpolators 201 to generate eight phase clock signals (e.g., 7 Ghz clock signals). For example, each clock divider circuit 203 divides a clock signal input into the clock divider circuit 203 from a corresponding one of the phase interpolators 201 in half and divides the phase of the inputted clock signal in half. As a result, the clock signals generated by the clock dividers 203 have phases separated by 45 degrees, in one example.

Clock divider 203 may include clock divider circuit 203A and clock divider circuit 203B. Inputs of clock divider circuit 203A receive the clock signals generated by phase interpolator 201A. Inputs of clock divider circuit 203B receive the clock signals generated by phase interpolator 201B. Since each clock divider circuit 203 receives two clock signals, each clock divider circuit 203 generates four clock signals with different phases. Since the four clock signals generated by the phase interpolators 201 are shifted in phase by 90 degrees, the clock divider circuit 203 generates eight phase clocks with 45-degree phase difference.

For example, clock divider circuit 203A generates from the clock signal 202A with a 270-degree phase shift, a clock signal with a 135-degree phase shift and a clock signal with a 315-degree phase shift (180-degrees apart from the 135-degree phase shift). Clock divider circuit 203A also generates from clock signal 202B with the 90-degree phase shift, a clock signal with a 45-degree phase shift and a clock signal with a 225-degree phase shift (e.g., 180 degrees apart from the 45-degree phase shift).

Clock divider circuit 203B generates from clock signal 202C with the 180-degree phase shift a clock signal a 90-degree phase shift and a clock signal with a 270-degree phase shift (e.g., 180 degrees apart from the 90-degree phase shift). Clock divider 203B also generates from the clock signal 202D with the 0-degree phase shift a clock signal with the 0-degree phase shift and a clock signal with a 180-degree phase shift (e.g., 180 degrees apart from the 0-degree phase shift).

As mentioned above, the clock generator 190 also includes a clock delay 204. The inputs of the clock delay 204 are connected to the output of the clock divider 203. The outputs of the clock delay 204 are connected to the ADC 120 as shown in FIG. 2A. In one embodiment, the clock delay 204 receives the clock signals generated by the clock divider 203 and corrects skew in the clock signals. The corrected clock signals with different sampling phases are the sampling clock signals 192 used by the ADC 120 to sample the analog input signal 112. The clock delay 204 corrects skew in the sampling clock signals based on a clock skew calibration signal 211. The clock skew calibration signal 211 may be received from the digital portion 103 of the receiver 100. Specifically, the clock skew calibration signal 211 is received from the phase control 180.

As shown in FIG. 2A, the clock delay 204 includes a plurality of clock delay circuits T_nd (e.g., clock delay circuits T_7d to T_0d) where n is an integer. In one embodiment, the clock delay circuits T_nd are arranged in a non-sequential order. In the arrangement shown in FIG. 2A, clock delay circuit T_7d is the last clock delay circuit and clock delay circuit T_0d is the first clock delay circuit where each adjacent clock delay circuit is separated by a 45-degree phase differential. Each clock delay circuit T_nd receives a corresponding one of the clock signals from the clock divider 204 and corrects the skew of each clock signal based on the clock skew calibration signal 211.

As mentioned above, the clock divider 203 generates eight different sampling clock signals 192 where each clock signal has a different phase than the other clock signals. Thus, the clock delay 204 includes eight clock delay circuits T_d that each receive a corresponding one of the eight different clock signals and corrects the skew in the received clock signal. For example, clock delay circuit T_7d receives the clock signal with the least phase (e.g., 0-degree phase shift), clock delay circuit T_6d receives the clock signal with 45-degree phase shift, clock delay circuit T_5d receives the clock signal with 90-degree phase shift, clock delay circuit T_4d receives the clock signal with the 135-degree phase shift, clock delay circuit T_3d receives the clock signal with the 180-degree phase shift, clock delay circuit T_2d receives the clock signal with the 225-degree phase shift, clock delay circuit T_1d receives the clock signal with the 270-degree phase shift, and clock delay circuit T_0d receives the clock signal with the 315-degree phase shift.

Each clock delay circuit T_nd outputs a corrected clock signal ADCCK as shown in FIG. 2A. For example, clock delay circuit T_7d outputs corrected clock signal ADCCK_7D, clock delay circuit T_6d outputs corrected clock signal ADCCK_6D, clock delay circuit T_5d outputs corrected clock signal ADCCK_5D, clock delay circuit T_4d outputs corrected clock signal ADCCK_4D, clock delay circuit T_3d outputs corrected clock signal ADCCK_3D, clock delay circuit T_2d outputs corrected clock signal ADCCK_2D, clock delay circuit T_1d outputs corrected clock signal ADCCK_1D, and clock delay circuit T_0d outputs corrected clock signal ADCCK_10. In one embodiment, the corrected clock signals ADCCK collectively form the sampling clock signals 192. Generally, each clock delay circuit T_*d included in the clock delay 204 compensates sampling phase skew for timing the interleaved ADC to guarantee the ADC has the best sampling phase.

ADC Architecture

As shown in FIG. 2A, each ADC 120 includes a track and hold device 205, sub-ADCs 205, and an ADC interface 209 according to one embodiment. The track and hold device 205 receives as its inputs the analog input signal 112 and the sampling clock signals 192. The track and hold device 205 tracks the analog input signal 112 and holds the value for a period of time. As shown in FIG. 2A, the track and hold device 205 includes a plurality of track and hold circuits TH (e.g., track and hold circuits TH_7d to TH_0d). Each track and hold circuit TH receives the analog input signal 112 and a corresponding one of the sampling clock signals 192.

In one embodiment, each track and hold circuit TH periodically samples the voltage level of the analog input signal 112 according to the sampling clock signal 192 received by the track and hold circuit TH and generates a sampled input signal as a result of the sampling. For example, track and hold circuit TH_7d samples the analog input signal 112 according to a sampling clock signal ADCCK_7D, track and hold circuit TH_6d samples the analog input signal 112 according to sampling clock signal ADCCK_6D, and so on. Similar to the clock delay circuits T_nd, the track and hold circuits TH are arranged in a non-sequential order.

Each track and hold circuit TH can be implemented by a switch connected to a capacitor. When the switch is closed, the track and hold circuit TH is in the "track" mode and tracks the analog input signal 112. When the switch opens, the last instantaneous value of the analog input signal 112 that was tracked is held in the capacitor and the track and hold circuit TH is in the "hold" mode.

The tracking phase of each track and hold circuit TH is controlled by pulses of the sampling clock signal received by the track and hold circuit TH. When the sampling clock signal is high, the track and hold circuit TH samples the analog input signal 112. When the sampling clock signal is low, the track and hold circuit TH holds the sampled value constant.

As shown in FIG. 2A, the track and hold device 205 is connected to a plurality of sub-ADCs 207 included in ADC 120. As shown in FIG. 2A, the sub-ADCs 207 are arranged in parallel. The sub-ADCs 207 include ADC_7D to ADC_0D where each sub-ADC is connected to a corresponding one of the track and hold circuits TH. For example, the input of ADC_7D is connected to the output of track and hold circuit TH7D, the input of ADC_6D is connected to the output of track and hold circuit TH6D, and so on. Thus, each sub-ADC 207 receives the sampled analog input signal from the track and hold circuit TH connected to the sub-ADC and generates a digital sample of the sampled analog input signal. Each sub-ADC 207 operates at a rate corresponding to the frequency of the sampling clock signals 192. In this example, each sub-ADC 207 operates at 7 Gbps for a 14 Gbps data rate given that the sampling clock signals 192 are 7 Ghz clock signals.

Referring now to FIG. 2B, a detailed block diagram of a sub-ADC_207 is shown. In one embodiment, each sub-ADC 207 includes a plurality of time-interleaved successive approximation (SAR) ADC slices. As shown in FIG. 2B, the time-interleaved SAR ADC slices are arranged in parallel. Each SAR ADC slice generates a digital sample of the sampled analog input signal received by the sub-ADC from its corresponding track and hold circuit TH. The combination of the digital samples generated by the SAR ADC slices form the digital sample generated by the sub-ADC.

In one embodiment, each SAR ADC slice included in the sub-ADC 207 operates at a data rate that is based on the data rate of the sub-ADC 207 and the number of SAR ADC slices included in the sub-ADC 207. For example, given that the sub-ADC 207 operates at 7 Gbps for a 14 Gbps data rate and includes eight SAR ADC slices, each SAR ADC slice operates at 875 Mbps for a 1.75 Gbps data rate with a total of 513 signals toggled.

Referring back to FIG. 2A, as mentioned above the ADC 120 also includes an ADC interface 209. The ADC interface 209 is coupled to the output of the sub-ADCs 207. The ADC interface 209 receives the digital samples of the sampled analog input signal outputted from the sub-ADCs 207. The ADC interface 209 aligns the digital samples in order to output the digital input samples 122. In one embodiment, the outputted digital input samples 122 have at least an 8-bit resolution.

In one embodiment, the ADC interface 209 aligns the digital samples based on interface clock signals 212. ADC interface 209 may receive a plurality of interface clock signals 212 where each interface clock signal 212 corresponds to one of the sub-ADC 207. The interface clock signals 212 are typically slower than the desired clock rate of the receiver 100. For example, interface clock signals 212 are 64 times slower than the desired clock rate of the receiver 100. If a 56G baud rate is configured for the receiver 100, the interface clock signals 212 are 875 MHz, for example.

As shown in FIG. 2A, the ADC interface 209 includes a set of registers 213 (e.g., flip flops). Each register includes an input connected to a corresponding one of the interface clock signals 212 and to the output of a corresponding one of the sub-ADCs 207. As will be further described below, the registers 213 and interface clock signals 212 may be used to turn off portions of the ADC interface 209 depending on the configured data rate of the receiver 100.

In one embodiment, each of the plurality of phase interpolators 201, clock dividers 203, clock delay circuits Td, track and hold circuits TH, and sub-ADCs 207 also includes a register. The register stores a value that either enables (e.g., turns on) or disables (e.g., turns off) the associated component that includes the register.

ADC Reconfiguration

In the examples herein, the receiver 100 is a PAM-4 receiver whether the data rate is double the operation rate (e.g., the sampling rate). For example, if the operation rate is 56G the data rate is 112G. However, the disclosure herein is also applicable to an NRZ receiver where the data rate is equivalent to the data rate.

In one embodiment, the time-interleaved ADCs 120 can be reconfigured based on the configured data rate of the receiver 100. The receiver 100 may be configured to operate at different data rates such as a maximum data rate (e.g., 112G), a minimum data rate (16G), and one or more intermediate data rates (e.g., 56G and 30G) between the maximum data rate and the minimum data rate. Based on the configured data rate of the receiver 100, each time-interleaved ADC 120 may be reconfigured by enabling or disabling parts of the ADC 120 and the clock generator 190. For example, all of the components included in the ADC 120 (e.g., track and hold circuits TH, sub-ADCs 207, and the entire ADC interface 209) may be enabled and all of the components of the clock generator 190 (e.g., phase interpolators 201, clock dividers 203, and clock delay circuits Td) may be enabled if the receiver 100 is configured to receive data at the maximum data rate. Conversely, only a portion of the components included in the ADC 120 and a portion of the clock generator 190 may be enabled if the receiver 100 is configured to operate at a data rate that is less than the maximum data rate, as will be further be described below.

When the receiver 100 is set to the maximum data rate, the ADCs 120 are set to a maximum data rate mode. In this example, the maximum data rate mode of the ADC 120 is a 56 Gbps mode assuming the maximum data rate for the receiver 100 is 56G. However, in other embodiments the maximum data rate can be different.

During the maximum data rate mode of the ADCs 120, all of components of each ADC 120 and the clock generator 190 are enabled as shown in FIG. 2A. That is, the entire set (e.g., a first set) of sub-ADCs 207, the entire set of track and hold circuits, and the entire portion of the ADC interface 209 included in each ADC 120 is enabled during the maximum data rate mode. Similarly, all of the phase interpolators, clock dividers 203, and clock delay circuits Td are enabled in the clock generator 190 during the maximum data rate mode.

In one embodiment, to enable all of components of the ADC 102 and the clock generator 190, the registers of all of the components included in the ADC 102 and the clock generator 190 store a value that enable the components. That is, each of the phase interpolators 201, clock divider circuits 203, clock delay circuits Td, track and hold circuits TH, sub-ADCs 207, and the entire ADC interface 209 have registers storing a value indicating enabling of the component.

In the maximum data rate mode, the ADCs 120 operate at 56 Gbps for a 112 Gbps data rate with eight 7 Ghz clocks being generated by the clock generator 190. The 7 GHz clock signals are sent to the eight track and hold circuits TH and all eight sub-ADC_207 are operational at a rate of 7 GBps for a 14 GBps data rate with each SAR slice included in the sub-ADCs 207 operating at a rate of 875 Mbps for a 1.75 GBps data rate.

The ADC 120 is also reconfigurable to support lower data rates as mentioned above. By being able to reconfigure the ADC 120, the receiver 100 can support legacy communication standards. The ADC 120 is reconfigurable by enabling only a portion of the ADC 120 and the clock generator 190 and disabling remaining portions of the ADC 120 and clock generator 190. To disable portions of the ADC 120 and the clock generator 190, the registers of the components of the ADC 120 and the clock generator 190 store values that turn off the components.

Figure 3:
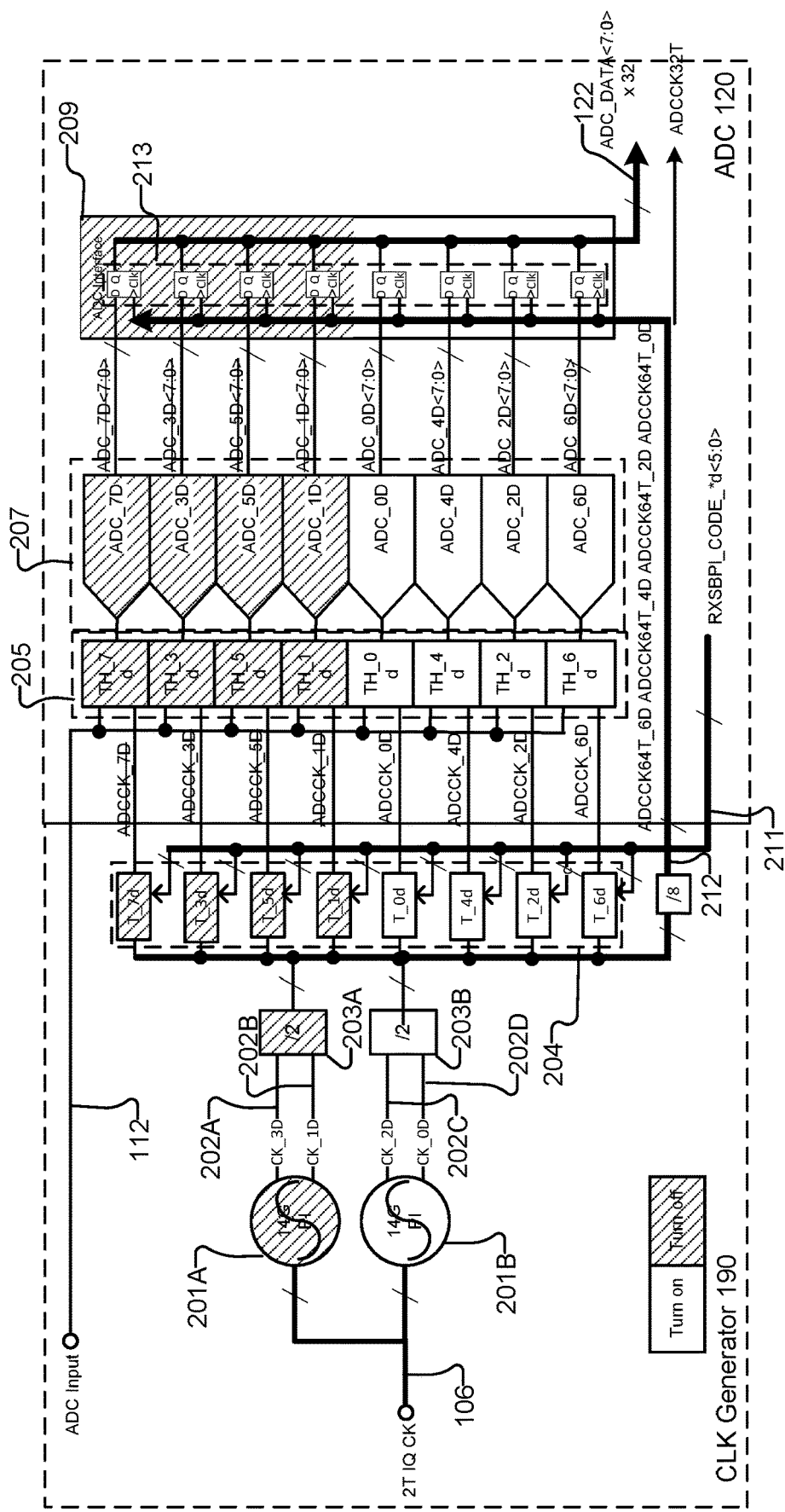
FIG. 3 is a detailed block diagram of the ADC and clock generator in the receiver of FIG. 1 operating at a second data rate, according to an embodiment.

FIG. 3 is an example of the receiver 100 operating at a data rate that is less than the maximum data rate for the receiver 100. In this example, the receiver 100 is operating at half of its maximum data rate. In the embodiments herein, the maximum data rate for the receiver 100 is 112G while the receiver 100 is operate at a maximum 56G baud rate. Thus, the receiver 100 is operating at 28G baud rate and the ADC 120 shown in FIG. 3 is reconfigured to a first intermediate data rate mode (e.g., 56 Gbps data rate).

Given that the data rate of the receiver 100 is half the maximum data rate, half of the components of the ADC 120 and the clock generator 190 are enabled and half are disabled during the first intermediate data rate mode to realize the desired data rate (e.g., 56 Gbps) as shown in FIG. 3. In FIG. 3, the clock generator 190 and the ADC 120 are respectively reconfigured such that a single phase interpolator and a second set of the sub-ADCs 207 (e.g., four of the sub-ADCs 207) are used in the first intermediate data rate mode.

As shown in FIG. 3, phase interpolator 201B and the second set of ADCs 207 including sub-ADC 0D, 4D, 2D, and 6D are enabled (e.g., turned on) and the remaining phase interpolator 201A and remaining set of sub-ADCs 7D, 3D, 5D, and 1D are disabled (e.g., powered off). The second set of ADCs 207 that are enabled during the first intermediate data rate mode is a subset of the first set of ADCs 207 that are enabled during the maximum data rate mode. Additionally, ADC 120 has improved phase linearity since a single phase interpolator is used during the first intermediate data rate mode rather than relying upon both phase interpolators to generate the clock signals for the enabled portion of the sub-ADC 207.

Furthermore, a portion of the clock divider 203B, a portion of the clock delay circuits T_0d, T_4d, T_2d, and T_6d, a portion of the track and hold circuits TH_0d, TH_4d, TH_2d, TH_6d, and a portion of the ADC interface 209 that are connected to the enabled phase interpolator 201B and the enabled set of the sub-ADC_207 are also enabled. Conversely, the remaining clock divider 203A, clock delay circuits T_7d, T_3d, T_5d, and T_1d, track and hold circuits TH_7d, TH_3d, TH_5d, TH_1d, and a portion of the ADC interface 209 that are connected to the disabled phase interpolator 201A and the disabled set of sub-ADCs 207 are also disabled. As described above, the components of the clock generator 190 and the ADC 120 are enabled or disabled based on the values stored in the registers of the components.

In one embodiment, FIG. 3 illustrates that the lower half of ADC 120 and the clock generator 190 are enabled while the upper half of the ADC 120 and the clock generator 190 are disabled. However, in other embodiments, the upper half of ADC 120 and the clock generator 190 are enabled while the lower half of the ADC 120 and the clock generator 190 are disabled.

Figure 4:
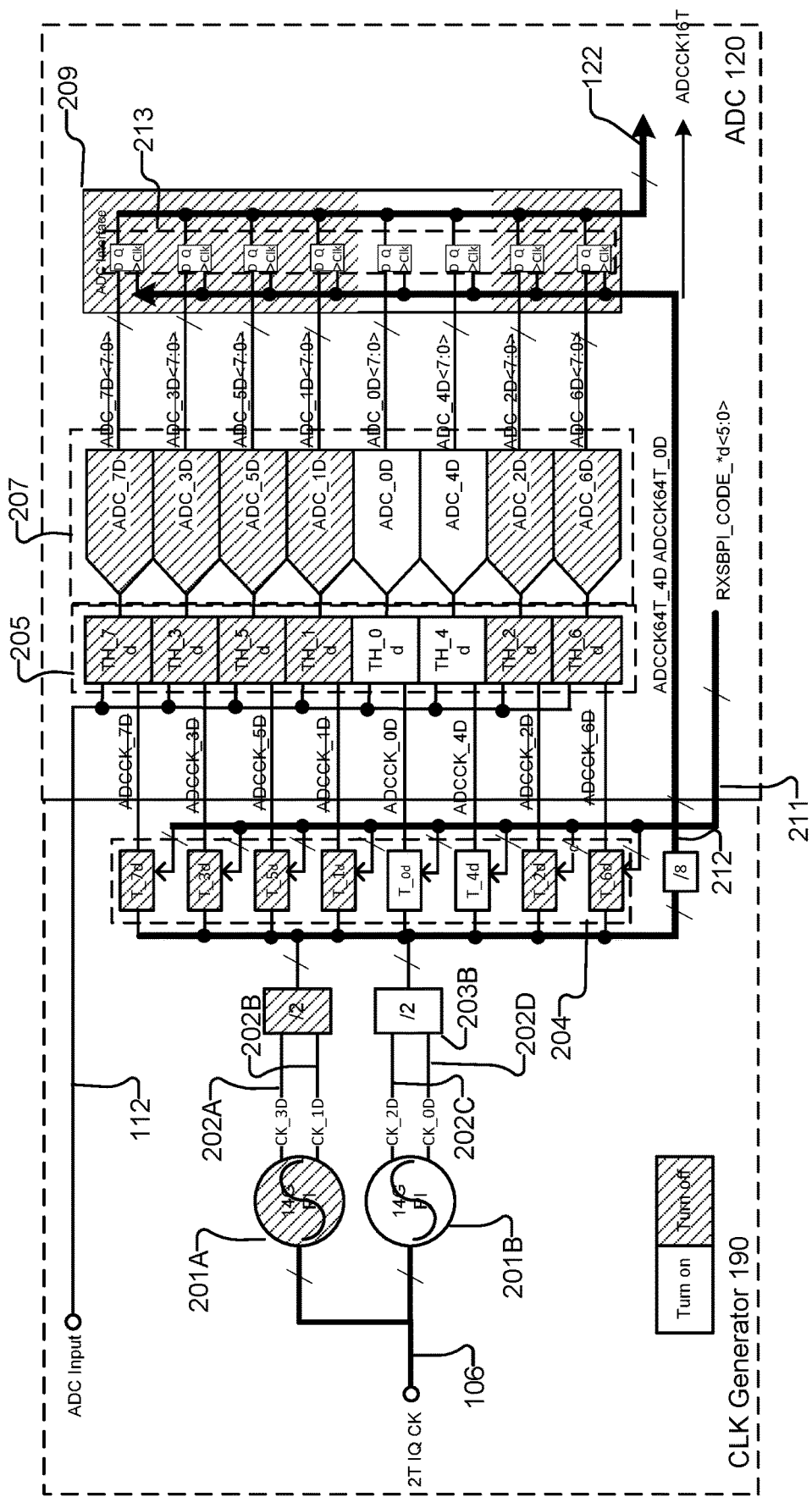
FIG. 4 is a detailed block diagram of the ADC and clock generator in the receiver of FIG. 1 operating at a third data rate, according to an embodiment.

FIG. 4 is another example of the receiver 100 operating at another intermediate data rate that is less than the maximum data rate for the receiver 100. In this example, the receiver 100 is operating at a second intermediate data rate that is less than the first intermediate data rate. For example, the receiver 100 is operating at 15 Gbps baud rate for a 30 Gbps data rate. The ADC 120 shown in FIG. 4 is reconfigured to a second intermediate data rate mode.

In the second intermediate data rate mode, the clock generator 190 and the ADC 120 are respectively reconfigured such that a single phase interpolator and a third set of sub-ADCs are enabled in the second intermediate data rate mode. In one embodiment, the third set of sub-ADCs includes two sub-ADCs such as sub-ADC 0D and 4D. Phase interpolator 201B is also enabled (e.g., turned on). Conversely, phase interpolator 201A and sub ADCs 7D, 3D, 5D, 1D, 2d, and 6D are disabled (e.g., turned off). Although ADC_0D and ADC_4D are enabled, in other embodiments any of the other sub-ADCs that are connected to phase interpolator 201B may be used in the second intermediate data rate mode.

Furthermore, the clock divider 203B, clock delay circuits T_0d and T_4d, track and hold circuits TH_0d and TH_4d, and a portion of the ADC interface 209 that are connected to the enabled phase interpolator 201B and the third set of sub-ADCs are also enabled. Conversely, the clock divider 203A, clock delay circuits T_7d, T_3d, T_5d, T_1d, T_2d, and T_6d, track and hold circuits TH_7d, TH_3d, TH_5d, TH_1d, TH_2d, and TH_6d, and a portion of the ADC interface 209 that are connected to the disabled phase interpolator 201A and the disabled portion of the sub-ADC 207 are also disabled.

Figure 5:
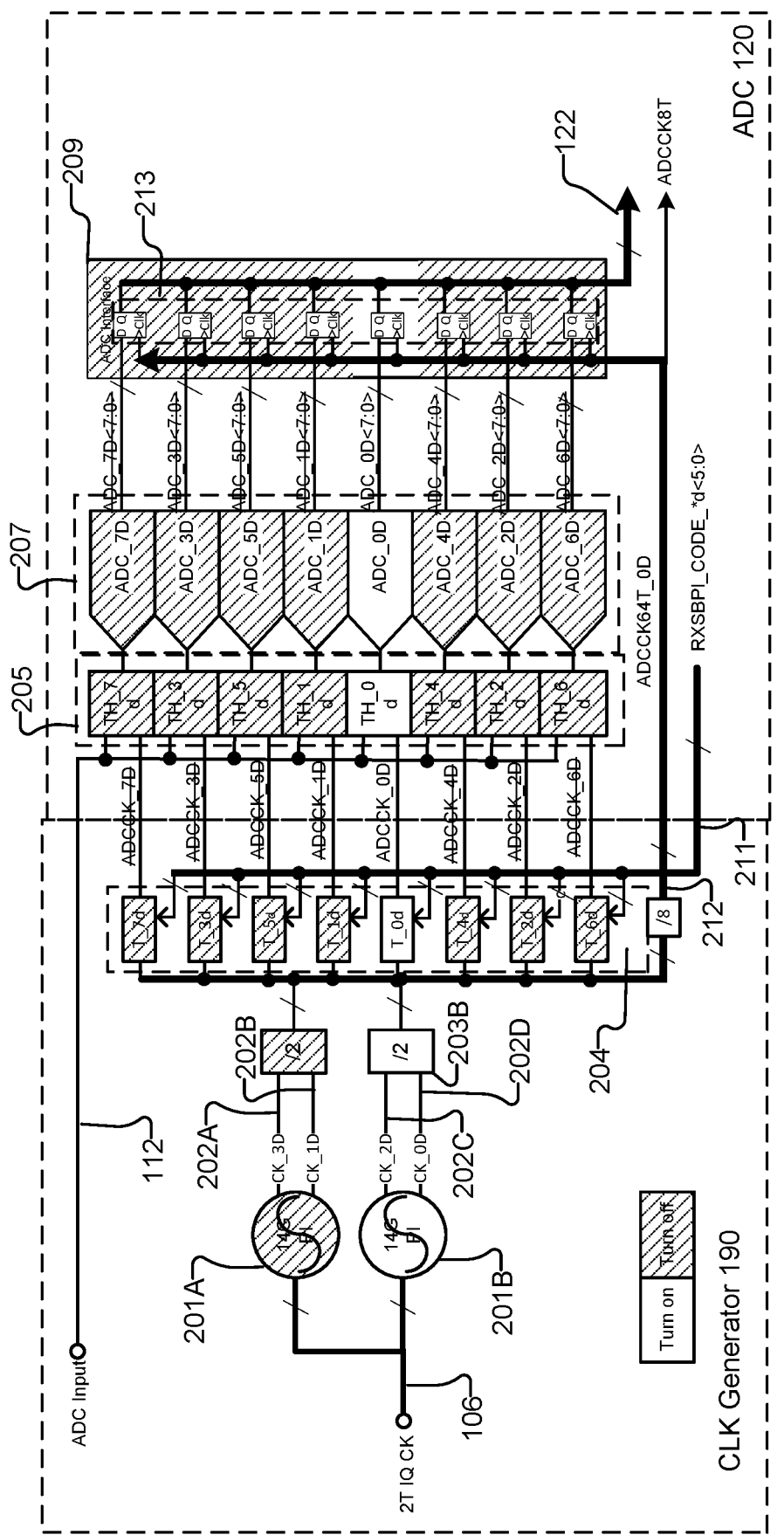
FIG. 5 is a detailed block diagram of the ADC and clock generator in the receiver of FIG. 1 operating at a fourth data rate, according to an embodiment.

FIG. 5 is an example of the receiver 100 operating at the minimum data rate of the receiver 100. For example, the receiver 100 is operating at 8 Gbps for a 16 Gbps data rate. The ADC 120 shown in FIG. 5 is reconfigured to a minimum data rate mode.

In the minimum data rate mode, the clock generator 190 and the ADC 120 are respectively reconfigured such that a single phase interpolator and a fourth set of sub-ADCs 207 are used in the minimum data rate mode. In one embodiment, the fourth set of sub-ADCs 207 includes a single sub-ADC 207. For example, in the minimum data rate mode phase interpolator 201B and sub-ADC 0D are enabled (e.g., turned on) and phase interpolator 201A and sub ADCs 7D, 6D, 5D, 4D, 3D, 2D, and 1D are disabled (e.g., turned off). Although ADC_0D is enabled, in other embodiments any of the other sub-ADCs that are connected to phase interpolator 201B may be used in the minimum data rate mode.

Furthermore, the clock divider 203B, clock delay circuits T_0d, track and hold circuit TH_0d, and a portion of the ADC interface 209 that are connected to the enabled phase interpolator 201B and sub-ADC_6D are also enabled. Conversely, the clock divider 203A, clock delay circuits T_7d, T_6d, T_5d, T_4d, T_3d, T_2d, and T_1d, track and hold circuits TH_7d, TH_6d, TH_5d, TH_4d, TH_3d, TH_2d, and TH_1d, and a portion of the ADC interface 209 that are connected to the disabled phase interpolator 201A and the disabled portion of the sub-ADC 207 are also disabled.

Sub-ADC Reconfiguration

Figure 6A:
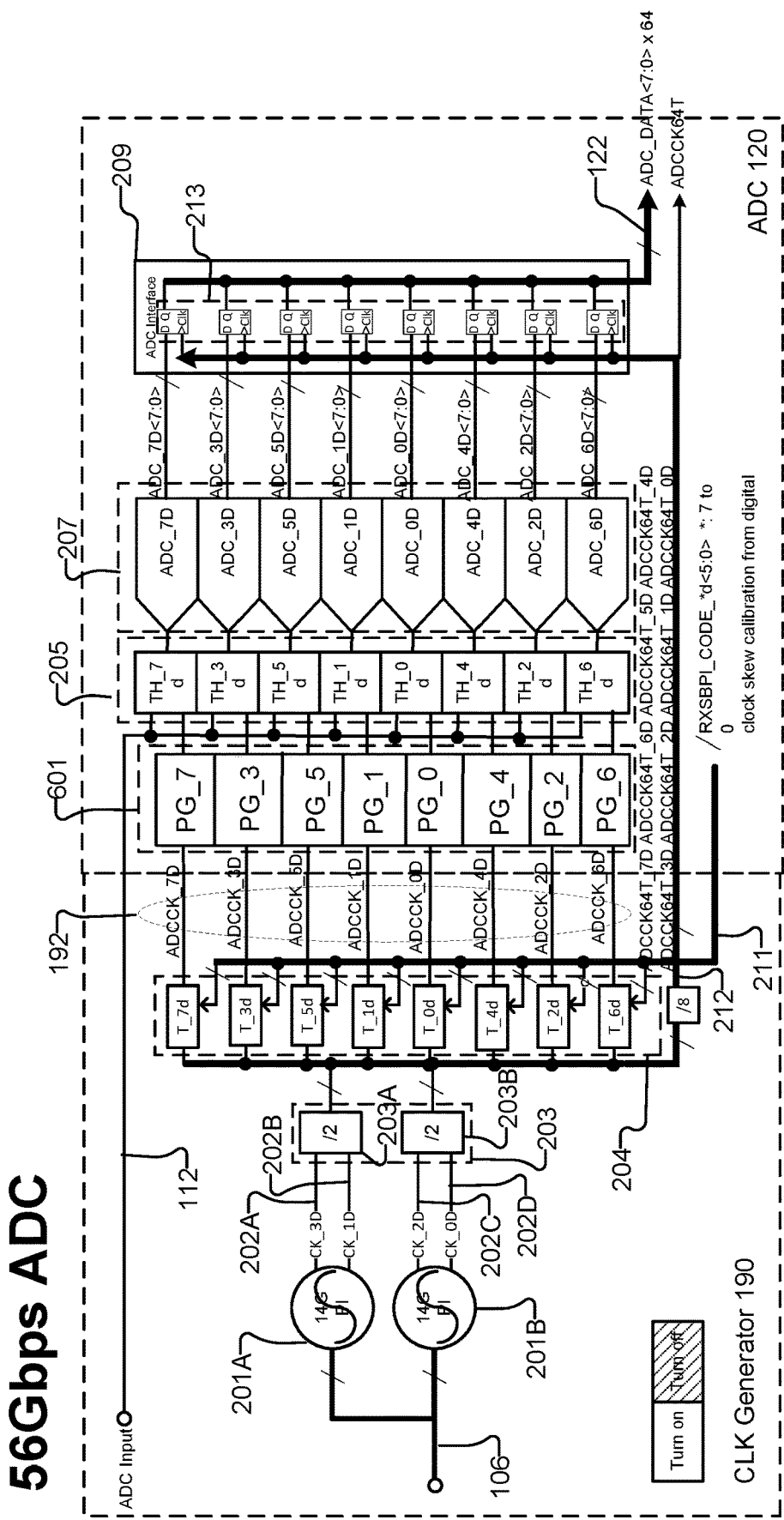
FIG. 6A is a detailed block diagram of an ADC, a pulse generator, and clock generator in the receiver of FIG. 1 according to an embodiment.

FIG. 6A is a detailed block diagram of the ADC 120 and clock generator 190 in the receiver 100, according to a second embodiment. The clock generator 190 and the ADC 120 included in the second embodiment of FIG. 6A includes similar components and perform similar functionality as the clock generator 190 and the ADC 120 described above with respect to FIGS. 2A-5. Thus, the description of the common components between the first embodiment and the second embodiment of the ADC 120 and the clock generator 190 are omitted.

Similar to the embodiments of FIGS. 2A-5, the second embodiment of the sub-ADC 120 shown in FIG. 6A can be reconfigured to operate at different data rates such as a maximum data rate (e.g., 112 Gbps), a minimum data rate (16 Gbps), and one or more intermediate data rates (e.g., 56 Gbps and 30 Gbps) between the maximum data rate and the minimum data rate by enabling or disabling parts of the ADC 120 and the clock generator 190, as previously described above.

In addition, each sub-ADC 120 can be further reconfigured based on an insertion loss mode of the receiver 100. In one embodiment, the receiver 100 is configured to operate in one of a plurality of different insertion loss modes regardless of the configured data rate of the receiver 100. Each of the different insertion loss modes is associated with a corresponding amount of insertion loss of the analog channel signal 104 that is acceptable during the recovery of the digital data 142 from the analog channel signal 104. Thus, the receiver 100 may be configured to operate at any of the different data rates as previously described above, but can be configured to target different insertion loss thereby providing different ADC resolution depending on the insertion loss mode of the receiver 100.

In one embodiment, the receiver 100 is configured to operate in three different insertion loss modes: a long reach (LR) mode, a medium reach (MR) mode, and a short reach (SR) mode. The receiver 100 may be able to operate in additional or fewer insertion loss modes in other embodiments. The receiver 100 is configured to operate in one of the insertion loss modes depending on the amount of insertion loss that is acceptable for the application of the receiver 100.

In one embodiment, the insertion loss of the analog channel signal 103 during the LR mode is greater than 30 dB. In contrast, the insertion loss of the analog channel signal 103 during the MR mode is in a range of 14 dB to 30 dB in one embodiment. Lastly, the insertion loss of the analog channel signal 103 during the SR mode is less than 15 dB. Generally, the LR mode is used for long range communication over long distance, the SR mode is used for short range communication over short distance, and the MR mode is used for medium range communication over distances between the long distance and short distance. For example, using current low loss PCB material that has 1 db/inch of loss at 28 GHz, short range communication in the SR mode is 12 inches, medium range communication in the MR mode is 25 inches, and long range communication in the LR mode is 35 inches. However, the distances may be different depending on the PCB material. As will be further described below, each sub-ADC 207 is reconfigured according to the insertion loss mode by enabling all of or a portion of the SAR ADC slices included each sub-ADC 207 and disabling any remaining portion of the SAR ADC slices without impacting the data rate of the configured data rate of the receiver 100. Since a portion of the SAR ADC slices of each sub-ADC 207 may be disabled depending on the insertion loss mode of the receiver 100, the receiver 100 may beneficially consume less power.

As shown in FIG. 6A, the second embodiment of the ADC 120 includes a pulse generator device 601. The pulse generator device 601 may be disposed between the track and hold device 205 and the clock delay 204 as shown in FIG. 6A. Generally, the pulse generator device 601 generates timing signals for the track and hold device 205 and the plurality of sub-ADCs 207 included in the ADC 120.

As shown in FIG. 6A, the pulse generator device 601 includes a plurality of pulse generator circuits PG_a (e.g., pulse generator circuits PG_0 to PG_7) where a is an integer. In one embodiment, the pulse generator circuits PG_a are arranged in a non-sequential order similar to the clock delay circuits T_nd described and the track and hold circuits TH described above. Each pulse generator circuit PG_a receives a corresponding one of the eight different sampling clock signals 192 from the clock delay 204. For example, pulse generator circuit PG_7 receives sampling clock signal ADCCK_7D from clock delay circuit T_7d, pulse generator circuit PG_3 receives sampling clock signal ADCC_3D from clock delay circuit T_3d, and so forth.

An output of each pulse generator circuit PG_a is connected to an input of a corresponding one of the track and hold circuits TH and an input of a corresponding one of the plurality of sub-ADCs 207. For example, the output of pulse generator PG_7 is coupled to an input of track and hold circuit TH_7d and an input of sub-ADC 7D, an output of pulse generator PG_3 is coupled to an input of track and hold circuit TH_3d and an input of sub-ADC_3D, and so forth. As will be described in further detail below, each pulse generator circuit PG_a generates timing signals for a corresponding one of the track and hold circuits TH_nd and a corresponding one of the plurality of sub-ADCs 207.

Figure 6B:
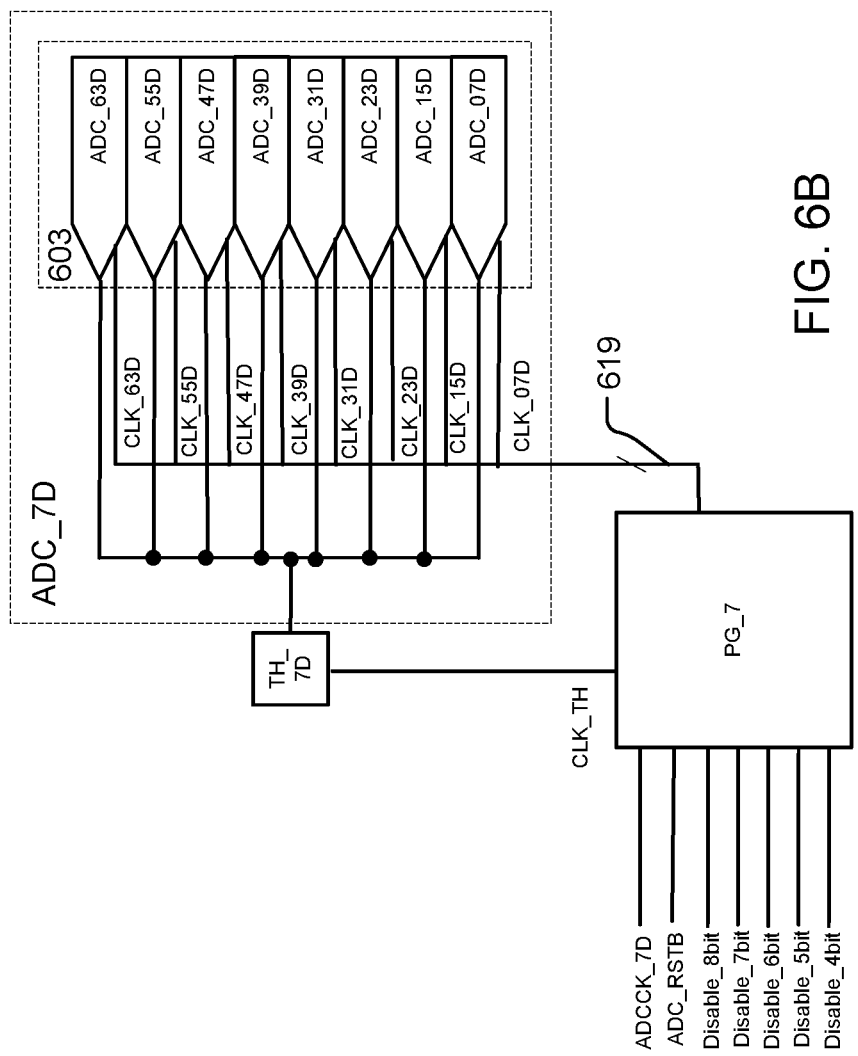
FIG. 6B is a detailed block diagram of a sub-ADC coupled to the pulse generator, according to an embodiment.

FIG. 6B illustrates a detailed block diagram of a sub-ADC according to one embodiment. As described above with respect to FIG. 2B, each sub-ADC 207 includes a plurality of time-interleaved (SAR) ADC slices. FIG. 6B illustrates the SAR ADC slices 603 of sub-ADC ADC_7D according to one embodiment. The SAR ADC slices include slice ADC_63D, slice ADC_55D, slice ADC_47D, slice ADC_39D, slice ADC_31D, slice ADC_23D, slice ADC_15D, and slice ADC_07D. Each SAR ADC slice receives the sampled analog input signal from the track and hold circuit TH connected to the sub-ADC. For example, the SAR ADC slices 603 receive the sampled analog input signal from track and hold circuit TH 7D.

FIG. 6B illustrates pulse generator circuit PG_7 coupled to the track and hold circuit TH_7D and the SAR ADC slices 603 included in sub-ADC ADC_7D. As mentioned above, each pulse generator circuit PG_a generates timing signals for a corresponding one of the track and hold circuits TH_nd and a corresponding one of the plurality of sub-ADCs 207. In one embodiment, the pulse generator circuit PG_7 generates the timing signals for the track and hold circuit TH_7D and the SAR ADC slices 603 based on one or more of the sampling clock signal 192 (e.g., ADCCK_7D) received from clock delay 204, a reset signal ADC_RSTB, and a plurality of disable bit signals (e.g., Disable_8 bit, Disable_7 bit, Disable_6 bit, Disable_5 bit, and Disable_4 bit). In one embodiment, the reset signal ADC_RSTB and the disable bit signals are provided to the pulse generator circuits via a register external to the ADC 120. The reset signal ADC_RSTB and the disable bit signals can be set to a high value (e.g., 1) or a low value (e.g., 0) or toggle in very low speed relative to the ADC 120 (e.g., KHz).

In one embodiment, a timing signal generated by the pulse generator circuit PG_7 includes a clock signal CLK_TH. The clock signal CLK_TH generated by the pulse generator circuit PG_7 is provided to the track and hold circuit TH_7D. In the second embodiment, each track and hold circuit TH periodically samples the voltage level of the analog input signal 112 according to the clock signal CLK_TH generated by the pulse generator PG_a rather than the sampling clock signal 192 as in the first embodiment. Thus, in FIG. 6B the track and hold circuit TH_7D outputs the sampled analog input signal 112 to the SAR ADC slices 603 included in sub-ADC ADC_7D according to the clock signal CLK_TH received from the pulse generator circuit PG_7. In one embodiment, the clock signal CLK_TH output by the pulse generator circuit PG_7 is the same signal as the sampling clock signal 192 (e.g., ADCCK_7D) received from the clock delay 204. In one embodiment, the clock signal CLK_TH has 50% duty cycle where the width of the high level pulse widths (e.g., 1 value) and the width of the low level pulse widths (e.g., 0 value) are equal.

In one embodiment, the timing signals generated by each pulse generator circuit PG_a includes a plurality of clock signals 619 for the corresponding SAR ADC slices. For example, the plurality of clock signals 619 generated by the pulse generator circuit PG_7 for the SAR ADC slices 603 include clock signal CLK_63D for SAR ADC slice ADC_63D, clock signal CLK_55D for SAR ADC slice ADC_55D, clock signal CLK_47D for SAR ADC slice ADC_47D, clock signal CLK_39D for SAR ADC slice ADC_39D, clock signal CLK_31D for SAR ADC slice ADC_31D, clock signal CLK_23D for SAR ADC slice ADC_23D, clock signal CLK_15D for SAR ADC slice ADC_15D, and clock signal CLK_07D for SAR ADC slice ADC_07D. The clock signals generated by each pulse generator circuit PG_a control the timing at which each respective SAR ADC slice generates a digital sample of the sampled analog input signal 112 received by the sub-ADC from its corresponding track and hold circuit TH.

Figure 6C:
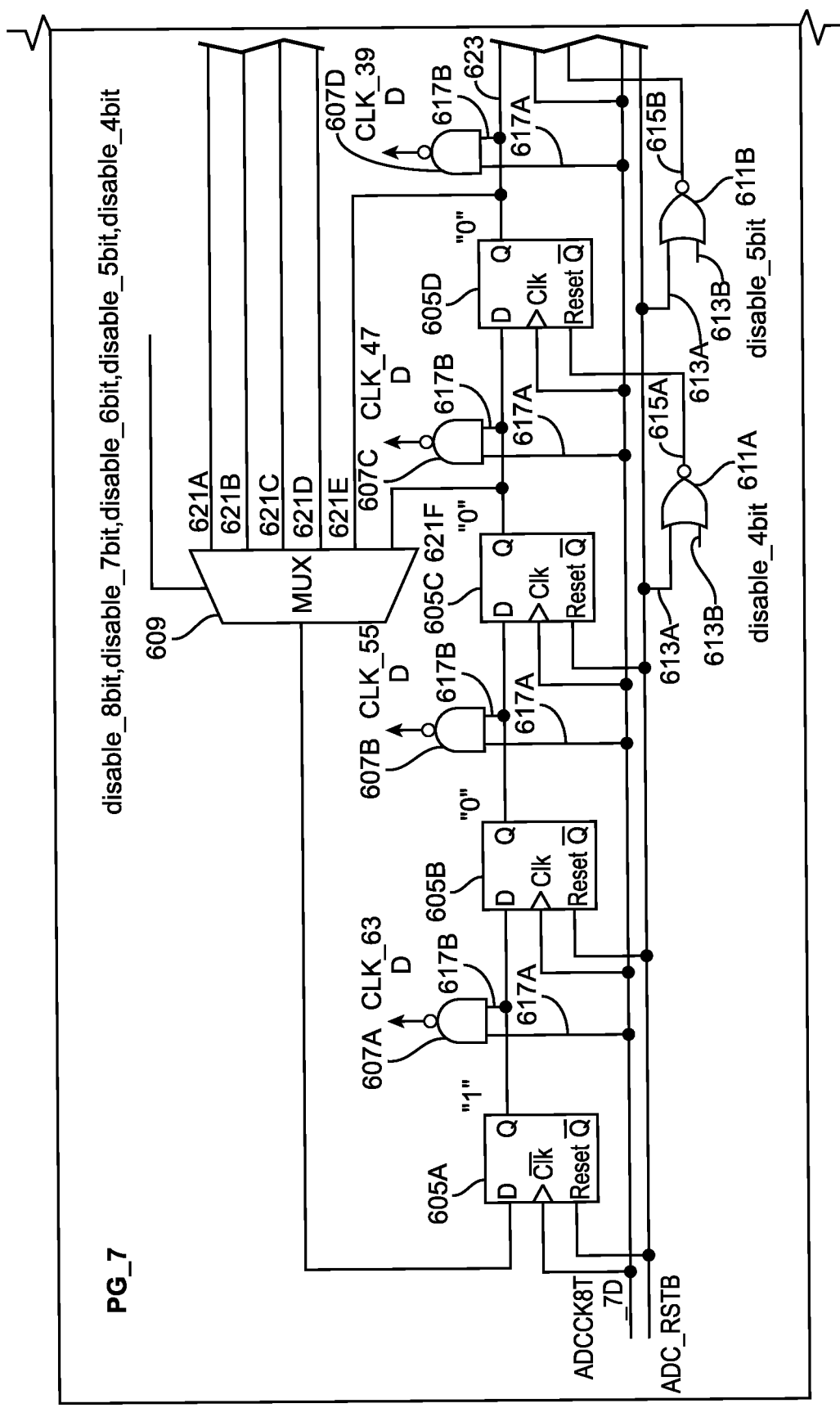
FIGS. 6C and 6D are a detailed block diagram of the pulse generator according to an embodiment.
Figure 6D:
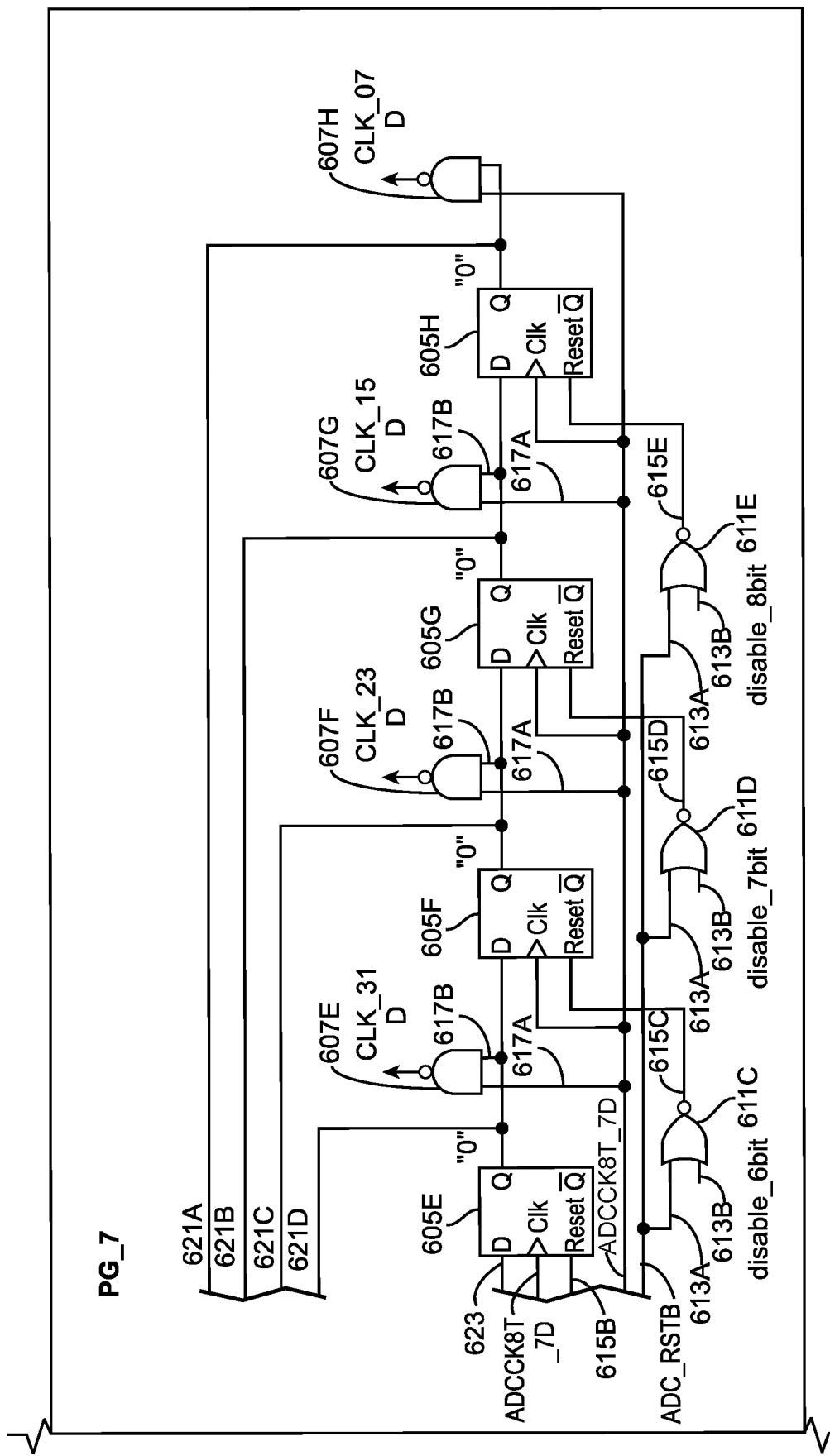

FIGS. 6C and 6D are a detailed block diagram of the pulse generator circuit PG_7 according to an embodiment. Note that FIG. 6CD is a continuation of the pulse generator circuit PG_7 shown in FIG. 6C. Furthermore, note that the other pulse generator circuits PG_a included in the pulse generator device 601 include the same structure as the pulse generator circuit PG_7 shown in FIG. 6C. In one embodiment, the pulse generator circuit PG_7 includes a plurality of registers 605, a multiplexor (MUX) 609, a plurality of NOR gates 611, and a plurality of NAND gates 607. In other embodiments, the pulse generator circuits may include other components than those shown in FIGS. 6C and 6D.

The plurality of registers include registers 605A to 605H in one embodiment. As shown in FIGS. 6C and 6D, the registers 605 are arranged in a cascaded arrangement such that the input (D) of a given register is the output (Q) of the previous register except for the first register 605A. For example, the input (D) of register 605B is the output (Q) of register 605A, the input (D) of register 605C is the output (Q) of register 605B, the input (D) of register 605D is the output (Q) of register 605C, the input (D) 623 of register 605E is the output (Q) of register 605D, the input (D) of register 605F is the output (Q) of register 605E, the input (D) of register 605G is the output (Q) of register 605F, and the input (D) of register 605H is the output (Q) of register 605G. In contrast, the input (D) of register 605A is the output of MUX 609.

As shown in FIGS. 6C and 6D, the inputs 621A-621F of the MUX 609 are the outputs (Q) of registers 605C to 605G in one embodiment. Furthermore, the input selector of the MUX 609 receives a plurality of disable bit signals (e.g., Disable_8 bit, Disable_7 bit, Disable_6 bit, Disable_5 bit, and Disable_4 bit). As will be further be described below, each disable bit signal disables the generation of a corresponding one of the plurality of clock signals 619 for the SAR ADC slices.

As shown in FIGS. 6C and 6D, the clock input (CLK) of the plurality of registers 605 all receive a common clock signal. For example, the clock input of the plurality of registers 605 is the sampling clock signal 192 received from the pulse generator circuit's respective clock delay circuit. In the example shown in FIGS. 6C and 6D where the pulse generator circuit is pulse generator circuit PG_7, the sampling clock signal 192 is signal ADCCK8T_7D.

In one embodiment, the reset input (Reset) of a first set of the plurality of registers 605 all receive the reset signal ADC_RSTB that resets the value stored in the first set of the plurality of registers back to a value of "0". The first set of the plurality of registers include registers 605A to 605C in one embodiment. The first set of registers all reset the value stored in the stored set of registers responsive to the registers 605 receiving the reset signal ADC_RSTB. In one embodiment, the first set of the plurality of registers are periodically reset such as after every four clock signals generated by the phase interpolators 201.

In one embodiment, the reset input of each register included in a second set of the plurality of registers (e.g., registers 605D to 605G) receives an output of a corresponding one of the plurality of NOR gates 611. The output of each of the plurality of NOR gates 611 is based on the reset signal ADC_RSTB and one of the plurality of disable bits.

For example, the input 613A of NOR gate 611A receives the reset signal ADC_RSTB and the input 613B of NOR gate 611A receives the disable bit disable_4 bit, and the output 615A of the NOR gate 611A is input to the reset input of register 605D. Similarity, the input 613A of NOR gate 611B receives the reset signal ADC_RSTB and the input 613B of NOR gate 611B receives the disable bit disable_5 bit, and the output 615B of the NOR gate 611B is input to the reset input of register 605E. The input 613A of NOR gate 611C receives the reset signal ADC_RSTB and the input 613B of NOR gate 611C receives the disable bit disable_6 bit, and the output 615C of the NOR gate 611C is input to the reset input of register 605F. The input 613A of NOR gate 611D receives the reset signal ADC_RSTB and the input 613B of NOR gate 611D receives the disable bit disable_7 bit, and the output 615D of the NOR gate 611D is input to the reset input of register 605G. Lastly, the input 613A of NOR gate 611E receives the reset signal ADC_RSTB and the input 613B of NOR gate 611E receives the disable bit disable_8 bit, and the output 615E of the NOR gate 611E is input to the reset input of register 605H. Thus, whether one of the registers from the second set of registers is reset is based on a combination of the reset signal ADC_RSTB and a reset bit signal corresponding to the given register.

The plurality of NAND gates 607 include NAND gates 607A to 607H in one embodiment. The plurality of NAND gates 607 generate the plurality of clock signals 619 for the SAR ADC slices 603. In the example where the pulse generator circuit PG_7 is generating the clock signals for sub-ADC ADC_7D, NAND gate 607A generates clock signal CLK_63D for SAR ADC slice ADC_63D, NAND gate 607B generates clock signal CLK_55D for SAR ADC slice ADC_55D, NAND gate 607C generates clock signal CLK_47D for SAR ADC slice ADC_47D, NAND gate 607D generates clock signal CLK_39D for SAR ADC slice ADC_39D, NAND gate 607E generates clock signal CLK_31D for SAR ADC slice ADC_31D, NAND gate 607F generates clock signal CLK_23D for SAR ADC slice ADC_23D, NAND gate 607G generates clock signal CLK_15D for SAR ADC slice ADC_15D, and NAND gate 607H generates clock signal CLK_7D for SAR ADC slice ADC_07D.

In one embodiment, each clock signal 619 is generated based on the sampling clock signal 192 received by the pulse generator circuit PG_a and an output (Q) of one of the registers 607. As shown in FIGS. 6C and 6D, each of the plurality of NAND gates 607 includes an input 617A connected to the sampling clock signal ADCCK8T_7D. The input 617B of each of the plurality of NAND gates 607 is connected to the output (D) of a corresponding one of the plurality of registers 605. For example, input 617B of NAND gate 607A is connected to the output Q of register 605A and generates the clock signal CLK_63D based on the output Q of register 605A and the sampling clock signal ADCCK8T_7D. Input 617B of NAND gate 607B is connected to the output Q of register 605B and generates the clock signal CLK_55D based on the output Q of register 605B and the sampling clock signal ADCCK8T_7D. Input 617B of NAND gate 607C is connected to the output Q of register 605C and generates the clock signal CLK_47D based on the output Q of register 605C and the sampling clock signal ADCCK8T_7D. Input 617B of NAND gate 607D is connected to the output Q of register 605D and generates the clock signal CLK_39D based on the output Q of register 605D and the sampling clock signal ADCCK8T_7D. Input 617B of NAND gate 607E is connected to the output Q of register 605E and generates the clock signal CLK_31D based on the output Q of register 605E and the sampling clock signal ADCCK8T_7D. Input 617B of NAND gate 607F is connected to the output Q of register 605F and generates the clock signal CLK_23D based on the output Q of register 605F and the sampling clock signal ADCCK8T_7D. Input 617B of NAND gate 607G is connected to the output Q of register 605G and generates the clock signal CLK_15D based on the output Q of register 605G and the sampling clock signal ADCCK8T_7D. Lastly, input 617B of NAND gate 607H is connected to the output Q of register 605H and generates the clock signal CLK_7D based on the output Q of register 605H and the sampling clock signal ADCCK8T_7D.

LR Mode

Figure 7A:
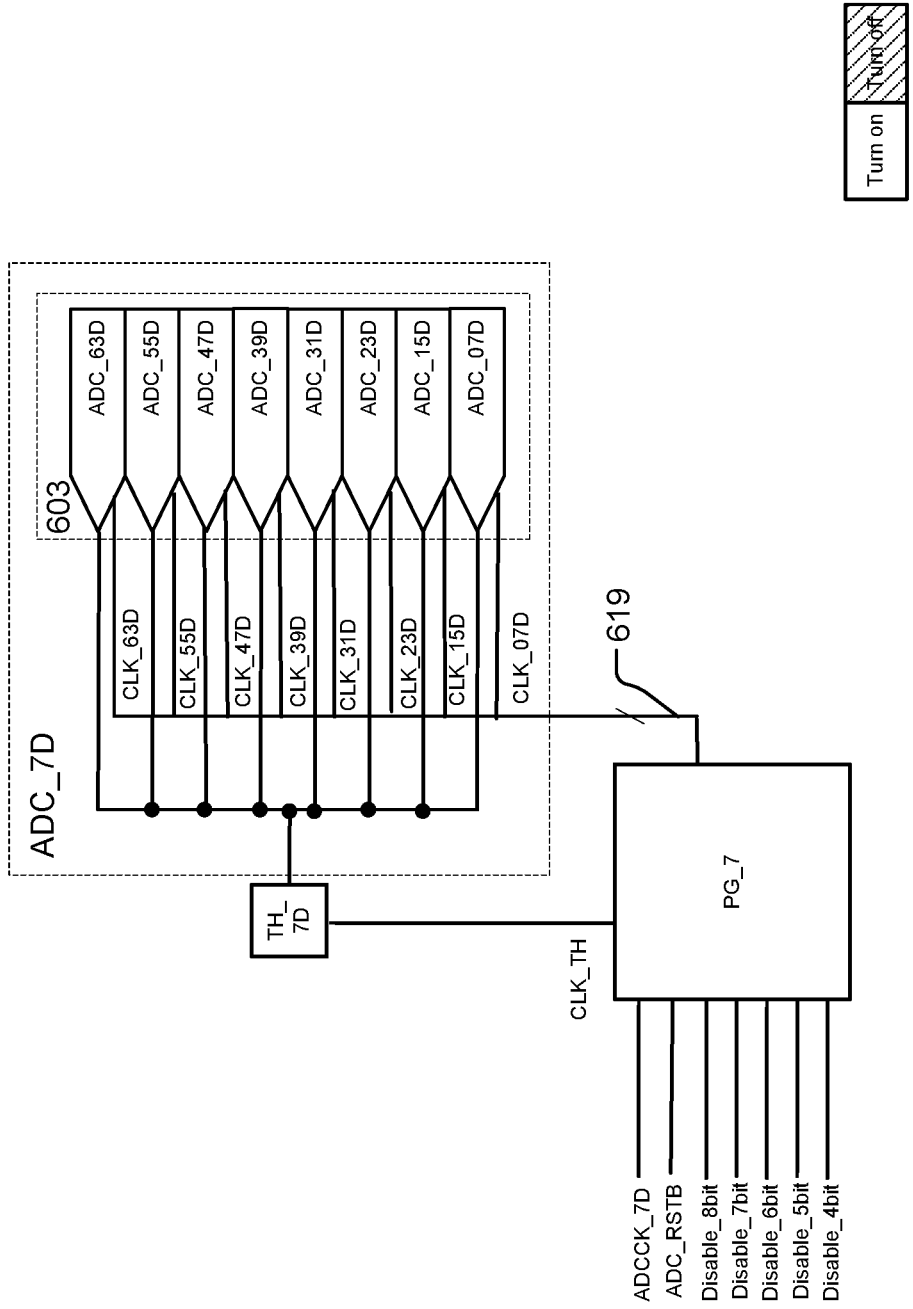
FIG. 7A is a detailed block diagram of a sub-ADC coupled to the pulse generator in a first insertion loss mode, according to an embodiment.

Referring to FIG. 7A, a detailed block diagram of a sub-ADC coupled to the pulse generator is shown while the receiver 100 is configured to operate in the LR mode (e.g., a first insertion loss mode), according to an embodiment. As mentioned previously, in the LR mode of the register 100, the insertion loss of the analog channel signal 103 is greater than 30db due to the LR mode being used in long range communication according to one embodiment. To achieve the insertion loss associated with the LR mode, all of the SAR ADC slices included in each of the plurality sub-ADCs 207 are enabled and none of the SAR ADC slices are disabled. For example, FIG. 7A illustrates that all of the SAR ADC slices 603 of the sub-ADC ADC_7D are enabled and none of the SAR ADC slices 603 of the sub-ADC ADC_7D are disabled.

During the LR mode, the pulse generator circuit PG_a that is connected to the sub-ADC enables all of the SAR ADC slices included in the sub-ADC by generating the clock signals for the SAR ADC slices that control timing of sampling of the analog input signal. For example, in FIG. 7A, pulse generator circuit PG_7 generates clock signal CLK_63D for SAR ADC slice ADC_63D, clock signal CLK_55D for SAR ADC slice ADC_55D, clock signal CLK_47D for SAR ADC slice ADC_47D, clock signal CLK_39D for SAR ADC slice ADC_39D, clock signal CLK_31D for SAR ADC slice ADC_31D, clock signal CLK_23D for SAR ADC slice ADC_23D, clock signal CLK_15D for SAR ADC slice ADC_15D, and clock signal CLK_07D for SAR ADC slice ADC_07D.

Figure 7B:
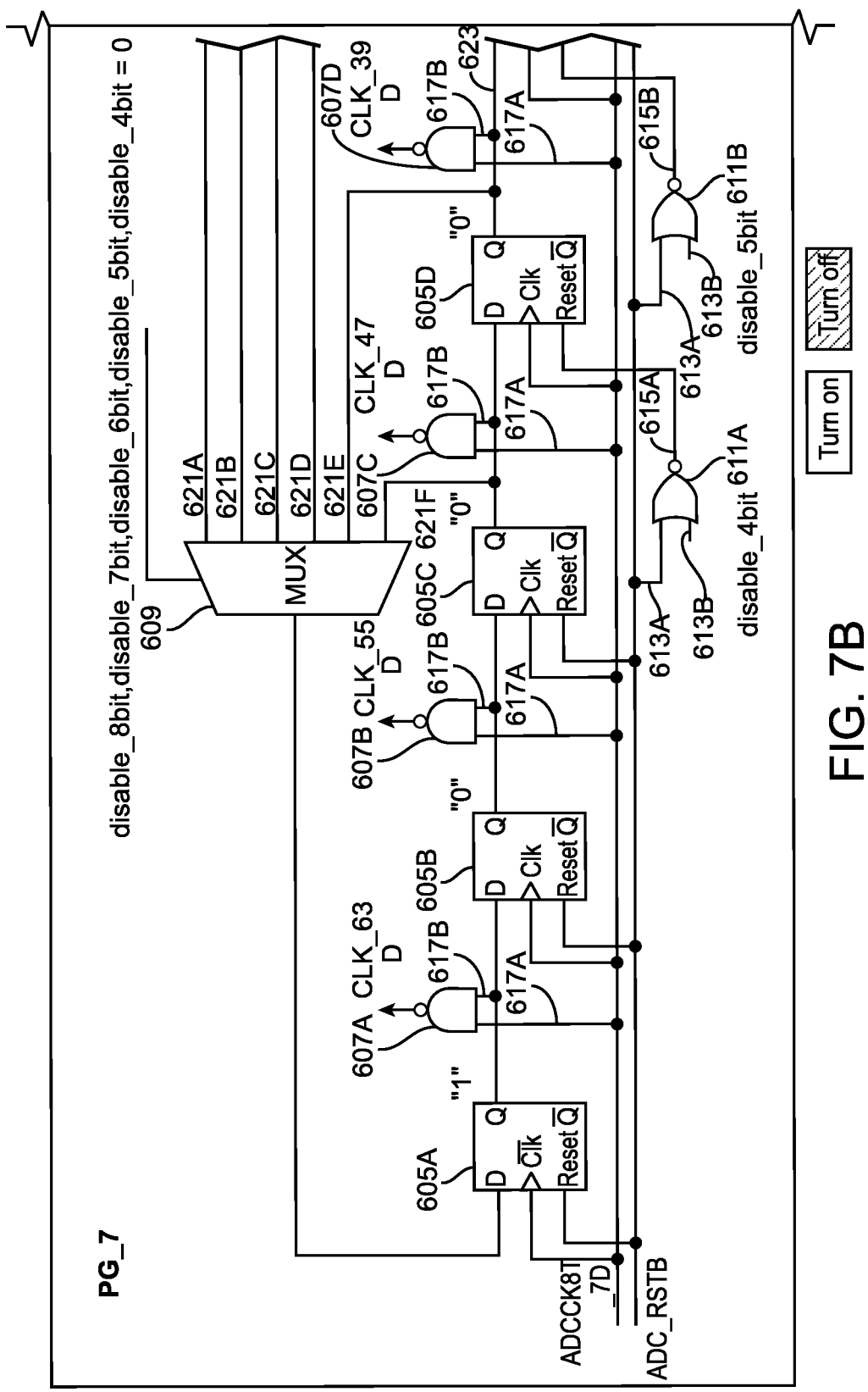
FIGS. 7B and 7C are a detailed block diagram of the pulse generator in the first insertion loss mode according to an embodiment.
Figure 7C:
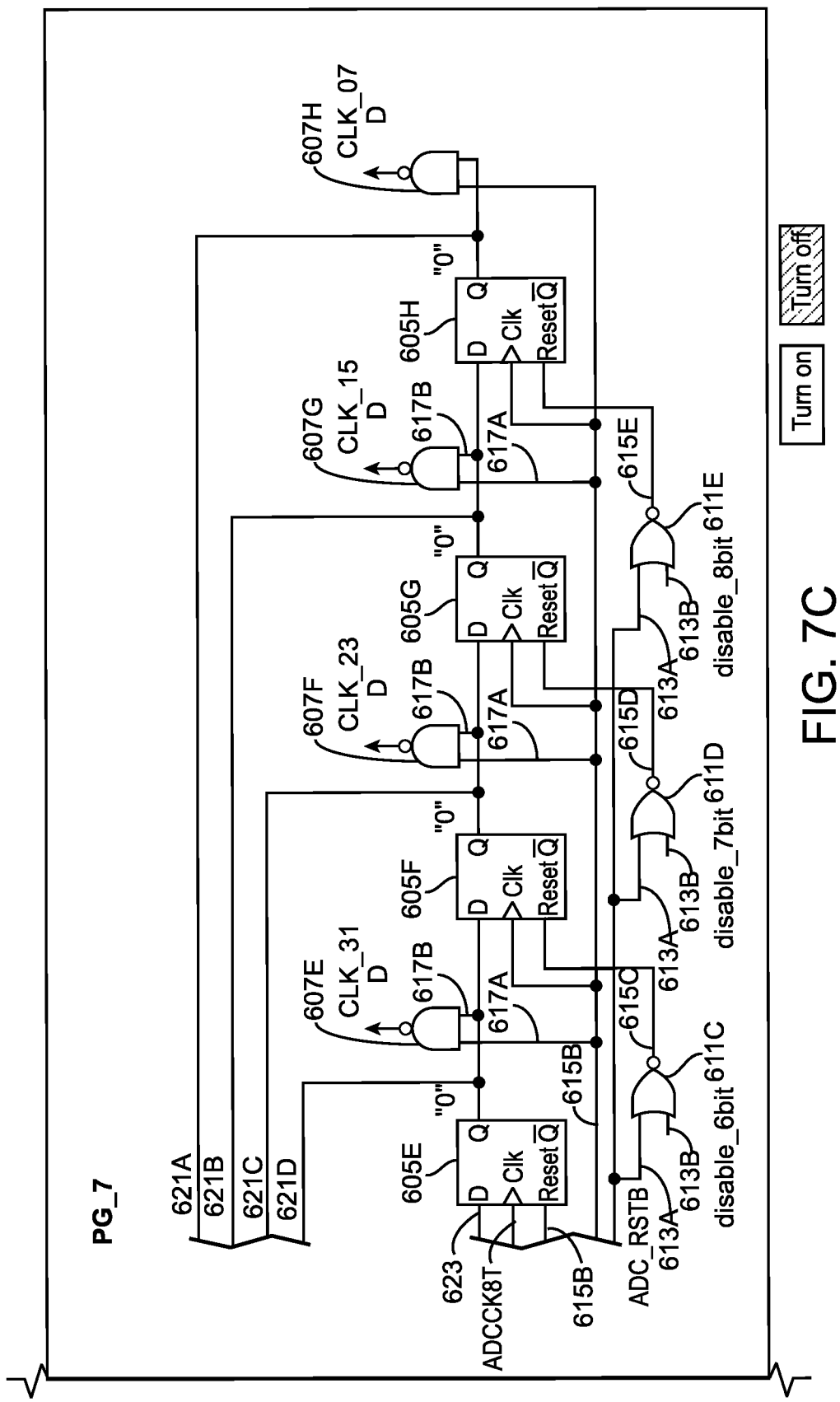
Figure 7D:
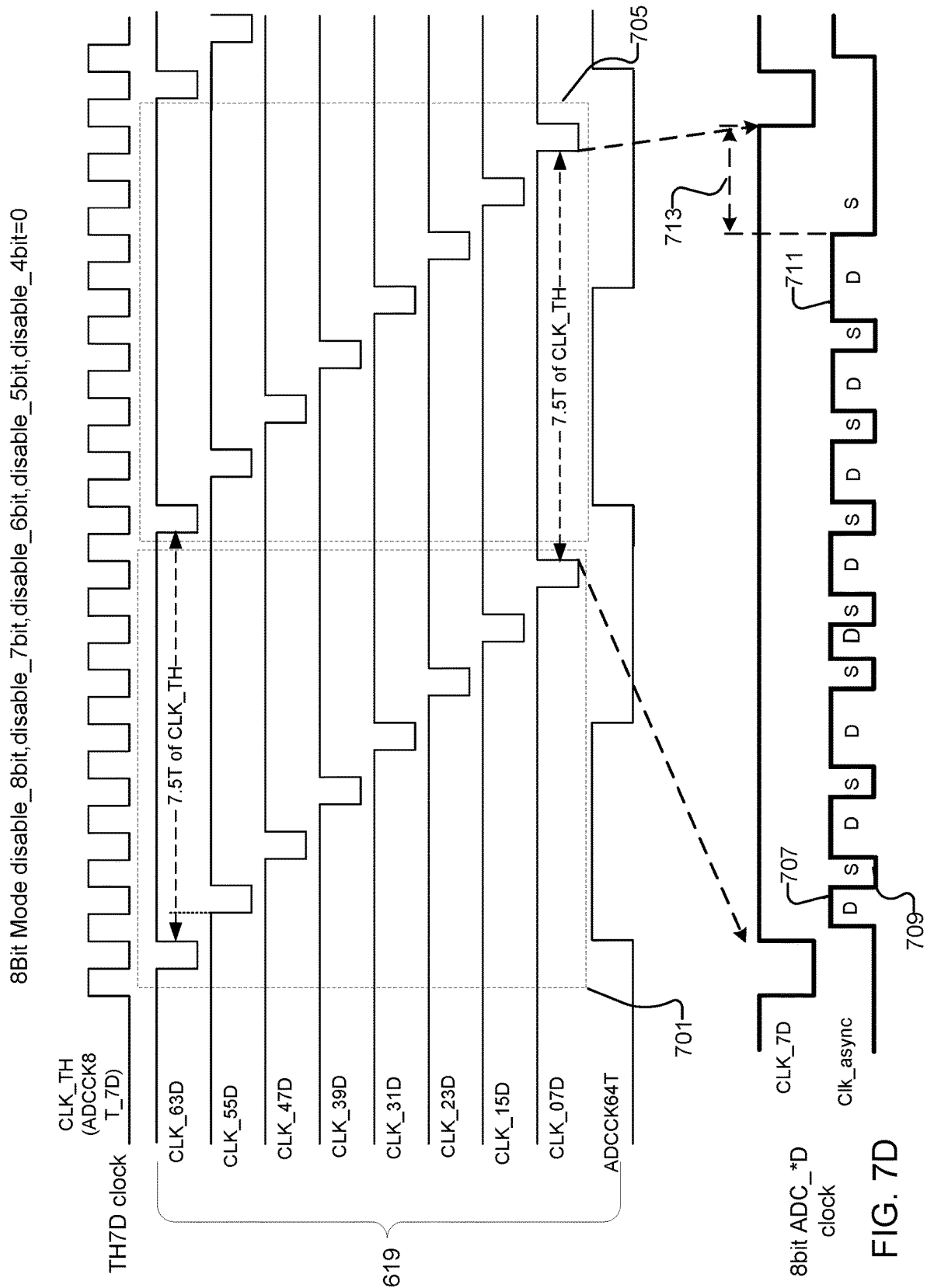
FIG. 7D is a wave form diagram of the receiver in the first insertion loss mode according to an embodiment.

FIGS. 7B and 7C illustrate a detailed view of the pulse generator circuit PG_7 during the LR mode and FIG. 7D illustrates the clock signals generated by the pulse generator circuit PG_7 during the LR mode according to one embodiment. Note that FIG. 7C is a continuation of the pulse generator circuit PG_7 shown in FIG. 7B. During the LR mode of the receiver 100, all of the disable bits are set to a value that enables the generation of the clock signals for all of the SAR ADC slices. For example, during the LR mode of the receiver 100, all of the disable bits are set to a value of "0". By setting the disable bits to "0", the pulse generator PG_a generates the clock signals 619 required to enable all of the SAR ADC slices due to the value of "0" causing NOR gates 611A to 611E output a value of "0" to the "Reset" input of the registers 605D to 605H regardless of the value of the reset signal ADC_RSTB. The value of "0" input to the "Reset" input of registers 605D to 605H prevents the registers 605D to 605H from resetting the value stored in the register. As a result of the disable bits being set to "0", pulse generator PG_7 generates clock signals CLK_63D, CLK_55D, CLK_47D, CLK_39D, CLK_31D, CLK_23D, CLK_15D, and CLK_7D as shown in FIG. 7B.

Furthermore, by setting the disable bits to "0" during the LR mode, the MUX 609 selects subsequent inputs for input (D) for the first register 605A based on the outputs (D) of registers 605C to 605H. As shown in FIG. 7D, the first pulse 701 of the clock signals 619 output by the pulse generator PG_a is separated from the second pulse 705 of the clock signals 619 by 8 pulses of the clock signal CLK_TH in one embodiment. The first pulse 701 and the second pulse of each of the clock signals are separated by 8 pulse of the clock signal due to all of the 8 SAR ADC slices being enabled in the LR mode. For example, the first pulse 701 of clock signal CLK_63D is separated by the second pulse 705D by 8 pulses of the clock signal CLK_TH.

To generate the second pulse 705 of the clock signal CLK_63D, the MUX 609 may select the input (D) for the first register 605A based on the output of the register 605C due to the disable bit disable 4 bit having a value of "0". Similarly, to generate the third pulse of the clock signal CLK_63D, the MUX 609 may select the input (D) for the first register 605A based on the output of the register 605D based on the output of the register 605D due to the disable bit disable 5 bit having a value of "0" and so on for each subsequent pulse of the clock signal CLK_63D. The pulse generator PG_a generates the clock signals for the remaining SAR slices in a similar manner.

As shown in FIG. 7D, during the LR mode the duration of a pulse width of each clock signal 619 is 7.5T of the clock signal CLK_TH. While each clock signal 619 for each SAR slice is at a state in which the SAR slice samples the analog input signal (e.g., a high value such as "1"), the corresponding SAR slice has a plurality of decision times 707 in which the SAR slice determines whether the analog input represents a value of "1" or "0" has a plurality of settling times 709 in which the analog input value can settle before the next decision time 707. Thus, a settling time 709 occurs before each subsequent decision time 707. FIG. 7D illustrates the decision times 707 and settling times 709 that occur in the SAR ADC slice ADC_07D while its clock signal CLK_7D is in the state at which the SAR ADC slice samples the analog input signal.

In one embodiment, the total possible number of decision times and the total possible number of settling times is the same and is based on the total number of SAR ADC slices that are enabled in each sub-ADC 207. In the example herein, each sub-ADC includes a total of 8 SAR slices that are enabled during the LR mode. Given that all of the SAR slices are enabled during the LR mode, there is a total of 8 decision times and 8 settling times during the LR mode in one embodiment.

After the last decision time 711, a timing margin 713 is provided before the clock signal 619 transitions to a state in which the SAR slice stops sampling the analog input (e.g., a low value such as "0"). The timing margin 713 ensures that all of the enabled SAR ADC slices has had sufficient amount of time to make a decision whether the analog input signal represents a value of "1" or "0" before the clock signal 619 for the SAR ADC slice transitions to the state in which the SAR slice stops sampling the analog input. The length of the timing margin 713 can be any length as along as the falling edge of the last decision time 711 occurs before the clock signal 619 for the SAR ADC slice transitions to the state in which the SAR slice stops sampling the analog input.

MR Mode

Figure 8A:
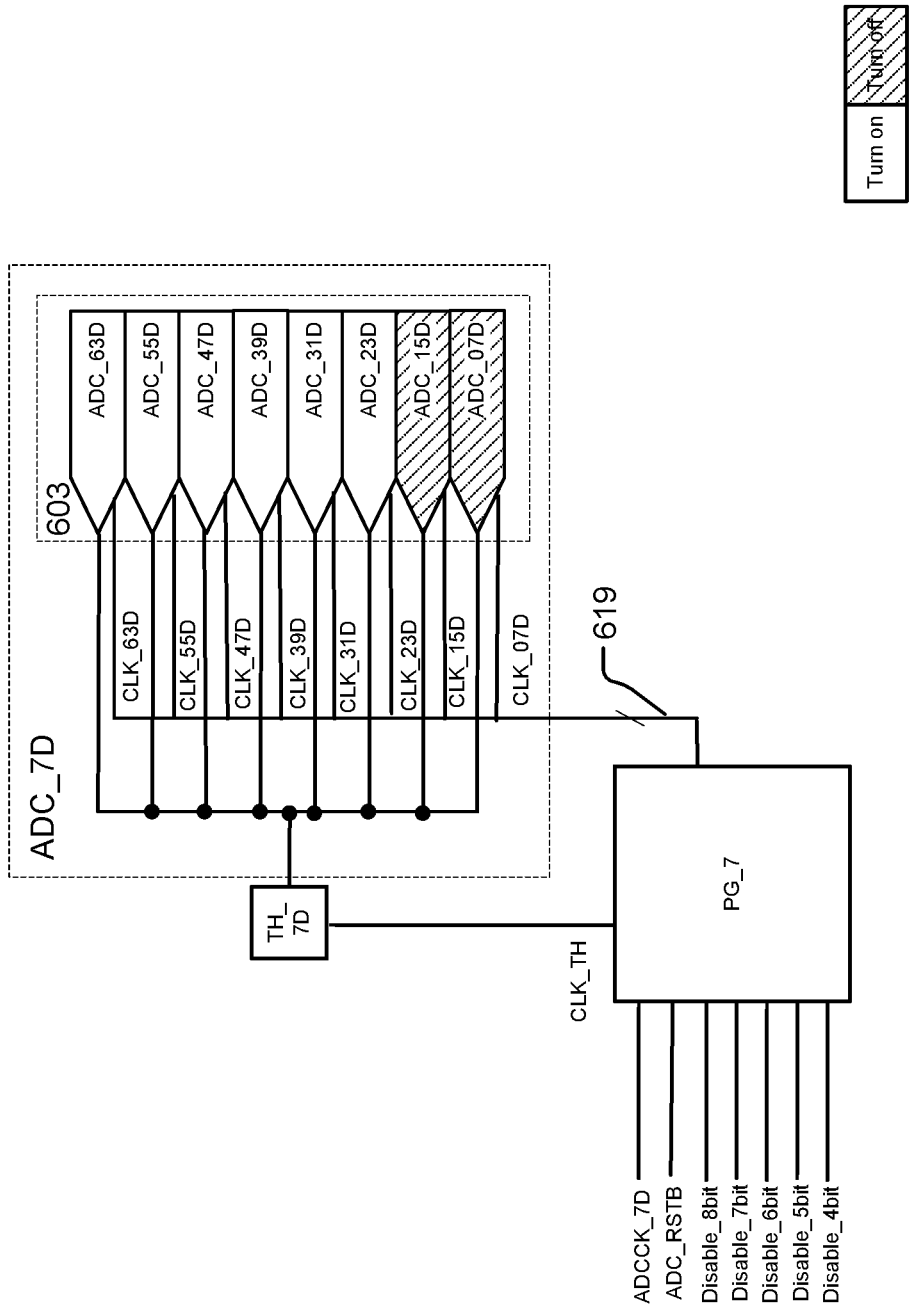
FIG. 8A is a detailed block diagram of a sub-ADC coupled to the pulse generator in a second insertion loss mode, according to an embodiment.

Referring to FIG. 8A, a detailed block diagram of a sub-ADC coupled to the pulse generator is shown while the receiver 100 is configured to operate in the MR mode (e.g., a second insertion loss mode), according to an embodiment. As mentioned previously, in the MR mode of the register 100, the insertion loss of the analog channel signal 103 is in a range of 14 dB to 30 dB due to the MR mode being used in medium range communication in one embodiment. To achieve the insertion loss associated with the MR mode, a first portion of the SAR ADC slices included in each of the plurality sub-ADCs 207 are enabled and a second portion of the SAR ADC slices are disabled. For example, FIG. 8A illustrates that the first portion of the SAR ADC slices 603 are enabled (e.g., SAR slices ADC_63D, ADC_55D, ADC_47D, ADC_39D, ADC_31D, and ADC_23D) and the second portion of SAR ADC slices 603 are disabled (e.g., SAR slices ADC_15D and ADC_07D). In one embodiment, 6 of the 8 SAR slices included in each sub-ADC are enabled and 2 of the 8 SAR slices are disabled and the SAR slices that are disabled are associated with the two most significant bits of the analog input signal.

During the MR mode, the pulse generator circuit PG_a that is connected to the sub-ADC enables the first portion the SAR ADC slices included in the sub-ADC by generating the clock signals 619 for the first portion the SAR ADC slices and disables the second portion of the SAR ADC slices by refraining from generating the clock signals for the second portion of the SAR ADC slices. In other words, the pulse generator circuit PG_a disables the second portion of the SAR ADC slices by not generating the clock signals for the second portion of the SAR ADC slices. For example, in FIG. 8A, pulse generator circuit PG_7 generates clock signal CLK_63D for SAR ADC slice ADC_63D, clock signal CLK_55D for SAR ADC slice ADC_55D, clock signal CLK_47D for SAR ADC slice ADC_47D, clock signal CLK_39D for SAR ADC slice ADC_39D, clock signal CLK_31D for SAR ADC slice ADC_31D, and clock signal CLK_23D for SAR ADC slice ADC_23D. Pulse generator circuit PG_7 does not generate clock signal CLK_15D for SAR ADC slice ADC_15D and clock signal CLK_7D for SAR ADC slice ADC_07D thereby disabling SAR ADC slices ADC_15D and ADC_07D.

Figure 8B:
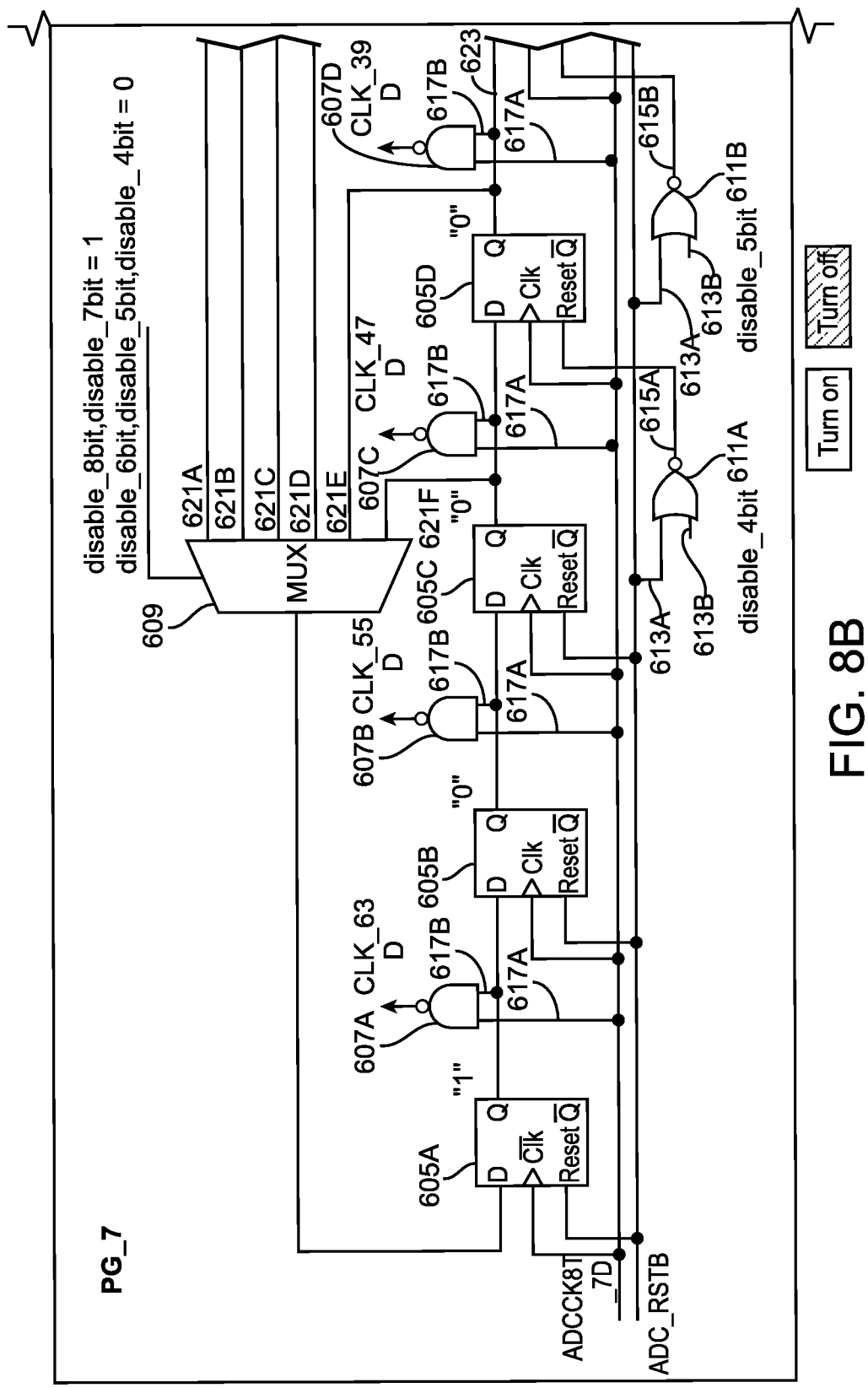
FIGS. 8B and 8C are a detailed block diagram of the pulse generator in the second insertion loss mode according to an embodiment.
Figure 8C:
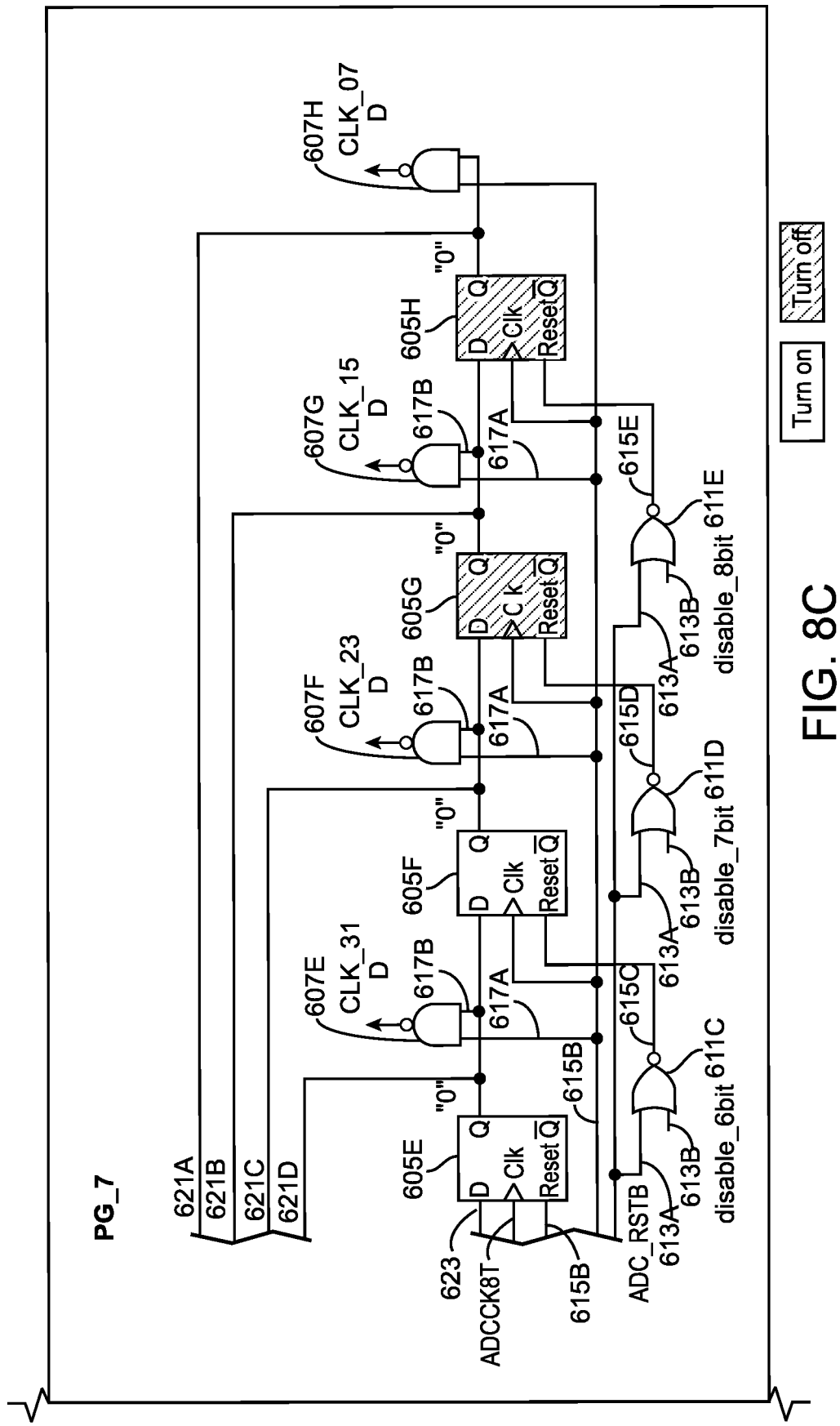
Figure 8D:
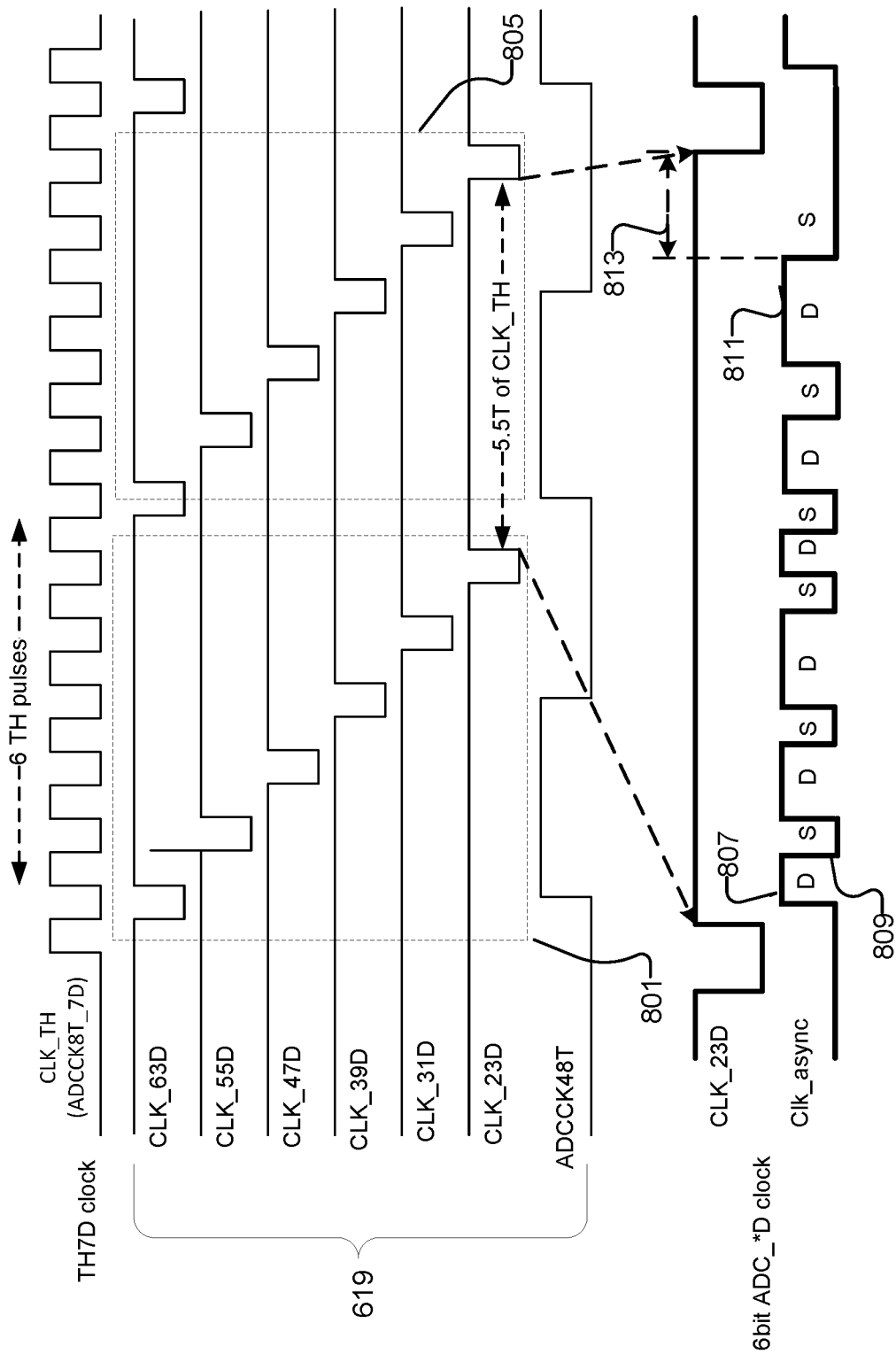
FIG. 8D is a wave form diagram of the receiver in the second insertion loss mode according to an embodiment.

FIGS. 8B and 8C illustrate a detailed view of the pulse generator circuit PG_7 during the MR mode and FIG. 8D illustrates the clock signals generated by the pulse generator circuit PG_7 during the MR mode according to one embodiment. Note that FIG. 8C is a continuation of the pulse generator circuit PG_7 shown in FIG. 8B. During the MR mode of the receiver 100, some of the disable bits are set to a value that disables the generation of the clock signals 619 for the second portion of the SAR slices and some of the disable bits are set to a value enables the generation of the clock signals for the first portion of the SAR slices. In one embodiment, the disable bits associated with the two most significant bits of the analog input signal are set to the value to disable the generation of the clock signals for the SAR ADC slices that sample the two most significant bits of the analog input signal. For example, during the MR mode of the receiver 100, the disable bits disable_7 bit and disable_8 bit are set to a value of "1" and the remaining disable bits disable_4 bit, disable_5 bit, and disable_6 bit are set to a value of "0".

By setting the disable bits disable_7 bit and disable_8 bit to the value of "1", the pulse generator PG_a does not generate the clock signals CLK_15D and CLK_07D. Clock signals CLK_15D and CLK_7D are not generated because the registers 605G and 605H that are responsible for generating the clock signals are reset due to the value of disable bits disable_7 bit and disable_8 bit and the reset signal ADC_RSTB causing th NOR gates 611D and 611E to output a value that resets the registers 605G and 605H. By setting the disable bits to "0" for the remaining disable bits disable_4 bit, disable_5 bit, and disable_6 bit, the pulse generator PG_a generates the clock signals required to enable the associated SAR ADC slices due to the value of the remaining disable bits and the reset signal ADC_RSTB causing NOR gates 611A to 611D output a value of "0" to the "Reset" input of the registers 605D to 605F. The value of "0" input to the "Reset" input of registers 605D to 605F prevents the registers 605D to 605F from resetting the value stored in the register. As a result of the disable bits disable_4 bit, disable_5 bit, and disable_6 bit being set to "0" and disable bits disable_7 bit and disable_8 bit being set to "1", pulse generator PG_7 generates clock signals CLK_63D, CLK_55D, CLK_47D, CLK_39D, CLK_31D, and CLK_23D as shown in FIG. 8D. As shown in FIG. 8D, clock signals CLK_15D and CLK_7D are not generated.

Furthermore, by setting the disable bits disable_7 bit and disable_8 bit to a value of "1" and the remaining disable bits disable_4 bit, disable_5 bit, and disable_6 bit to a value of "0", the MUX 609 selects subsequent inputs for input (D) for the first register 605A based on the outputs (D) of registers 605C to 605F, but not registers 605G and 605H in comparison to the LR mode. As shown in FIG. 8D, the first pulse 801 of the clock signals output by the pulse generator PG_a is separated from the second pulse 805 of the clock signals by 6 pulses of the clock signal CLK_TH in the MR mode compared to 8 pulses in the LR mode in one embodiment since only 6 SAR ADC slices are enabled in the MR mode. For example, the first pulse 801 of clock signal CLK_63D is separated by the second pulse 805 by 6 pulses of the clock signal CLK_TH.

To generate the second pulse 605 of the clock signal CLK_63D, the MUX 609 may select the input (D) for the first register 605A based on the output of the register 605C due to the disable bit disable_4 bit having a value of "0". Similarly, to generate the third pulse of the clock signal CLK_63D, the MUX 609 may select the input (D) for the first register 605A based on the output of the register 605D based on the output of the register 605D due to the disable bit disable_5 bit having a value of "0" and so on for each subsequent pulse of the clock signal CLK_63D. The pulse generator PG_a generates the clock signals for the remaining SAR slices in a similar manner.

According to one embodiment, the duration of the pulse width of each clock signal 619 in the MR mode is less than the duration of the pulse width of each clock signal 619 in the LR mode. As shown in FIG. 8D, during the MR mode the duration of the pulse width of each clock signal 619 is 5.5T of the clock signal CLK_TH whereas the duration of the pulse width of each clock signal 619 is 7.5T of the clock signal CLK_TH during the LR mode. While each clock signal for each SAR slice is at a state in which the SAR slice samples the analog input (e.g., a high value such as "1"), the corresponding SAR slice has a plurality of decision times 807 in which the SAR slice determines whether the analog input represents a value of "1" or "0" has a plurality of settling times 809 in which the analog input value can settle before the next decision time 807. Thus, a settling time 809 occurs before each subsequent decision time 807 as shown in FIG. 8D. FIG. 8D illustrates the decision times 807 and settling times 809 that occur in the SAR ADC slice ADC_23D while its clock signal CLK_23D is in the state at which the SAR ADC slice samples the analog input signal.

Similar to the LR mode, the total possible number of decision times and the total possible number of settling times is the same and is based on the total number of SAR slices in each sub-ADC_207 that are enabled during the MR mode. In the example herein, each sub-ADC includes a total of 8 SAR slices, but only 6 of the SAR slices are enabled in the MR mode. Thus, the total number of decision times is 6 and the total number of settling times is also 6 in the MR mode according to one embodiment.

After the last decision time 811, a timing margin 813 is provided before the clock signal transitions to a state in which the SAR ADC slice stops sampling the analog input (e.g., a low value such as "0"). Similar to the LR mode, the timing margin 813 in the MR mode ensures that all of the enabled SAR ADC slices has had sufficient amount of time to make a decision whether the analog input signal represents a value of "1" or "0" before the clock signal 619 for the SAR ADC slice transitions to the state in which the SAR ADC slice stops sampling the analog input. In one embodiment, the timing margin 813 in the MR mode is the same as the timing margin 713 in the LR mode even though only 6 bits of the analog input signal are sampled in the MR mode thereby preventing increased dead space between the last decision time 811 and the transition of the clock signal 619.

SR Mode

Figure 9A:
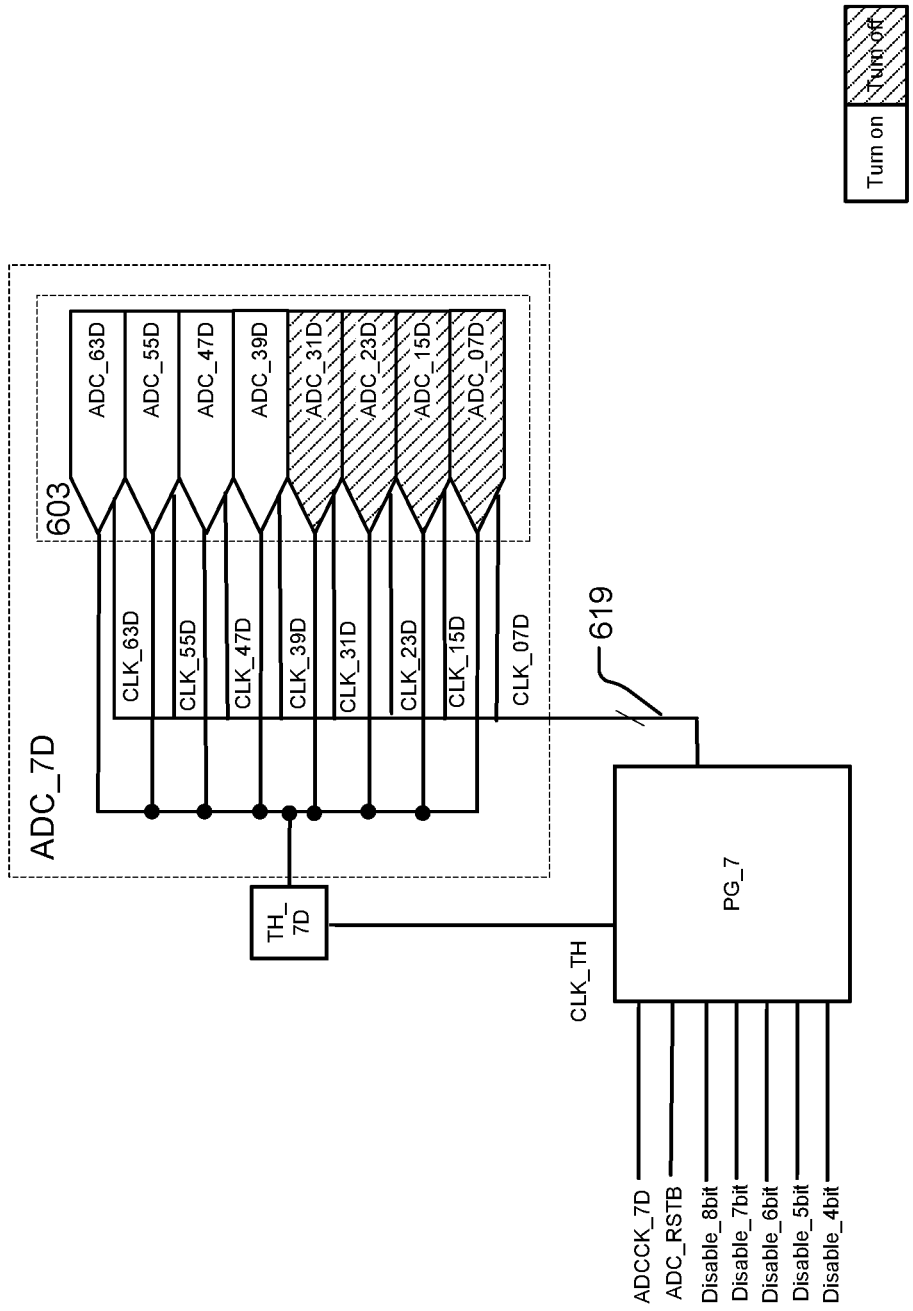
FIG. 9A is a detailed block diagram of a sub-ADC coupled to the pulse generator in a third insertion loss mode, according to an embodiment.

Referring to FIG. 9A, a detailed block diagram of a sub-ADC coupled to the pulse generator is shown while the receiver 100 is configured to operate in the SR mode (e.g., a third insertion loss mode), according to an embodiment. As mentioned previously, in the SR mode of the register 100, the insertion loss of the analog channel signal 103 is less than 15 dB due to the SR mode being used in short range communication in one embodiment. To achieve the insertion loss associated with the SR mode, a first portion of the SAR ADC slices included in each of the plurality sub-ADCs 207 are enabled and a second portion of the SAR ADC slices are disabled. For example, FIG. 9A illustrates that the first portion of the SAR ADC slices 603 are enabled (e.g., SAR slices ADC_63D, ADC_55D, ADC_47D, and ADC_39D) and the second portion of SAR ADC slices 603 are disabled (e.g., ADC_31D, ADC_23D, ADC_15D, and ADC_07D). In one embodiment, half of the SAR slices included in each sub-ADC are enabled (e.g., 4 slices) and half of the SAR slices are disabled (e.g., 4 slices). In one embodiment, the SAR slices that are disabled are associated with the four most significant bits of the analog input signal.

During the SR mode, the pulse generator circuit PG_a that is connected to the sub-ADC enables the first portion the SAR ADC slices included in the sub-ADC by generating the clock signals 619 for the first portion the SAR ADC slices and disables the second portion of the SAR ADC signals by not generating the clock signals 619 for the second portion of the SAR ADC slices. For example, in FIG. 9A, pulse generator circuit PG_7 generates clock signal CLK_63D for SAR ADC slice ADC_63D, clock signal CLK_55D for SAR ADC slice ADC_55D, clock signal CLK_47D for SAR ADC slice ADC_47D, and clock signal CLK_39D for SAR ADC slice ADC_39D. However, pulse generator circuit PG_7 does not generate clock signal CLK_31D for SAR ADC slice ADC_31D, clock signal CLK_23D for SAR ADC slice ADC_23D, clock signal CLK_15D for SAR ADC slice ADC_15D, and clock signal CLK_07D for SAR ADC slice ADC_07D thereby disabling SAR ADC slices ADC_31D, ADC_23D, ADC_15D and ADC_07D.

Figure 9B:
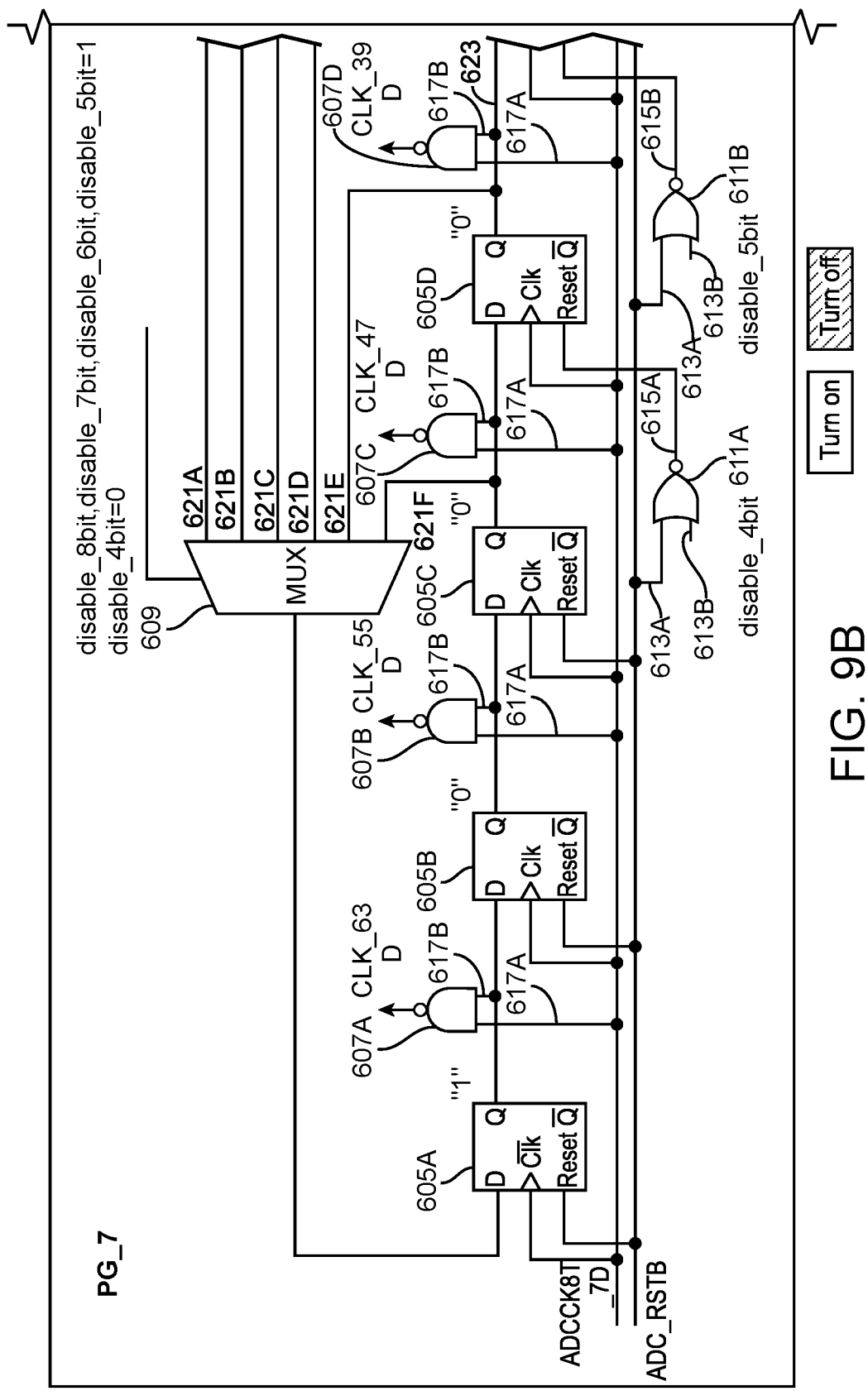
FIGS. 9B and 9C are a detailed block diagram of the pulse generator in the third insertion loss mode according to an embodiment.
Figure 9C:
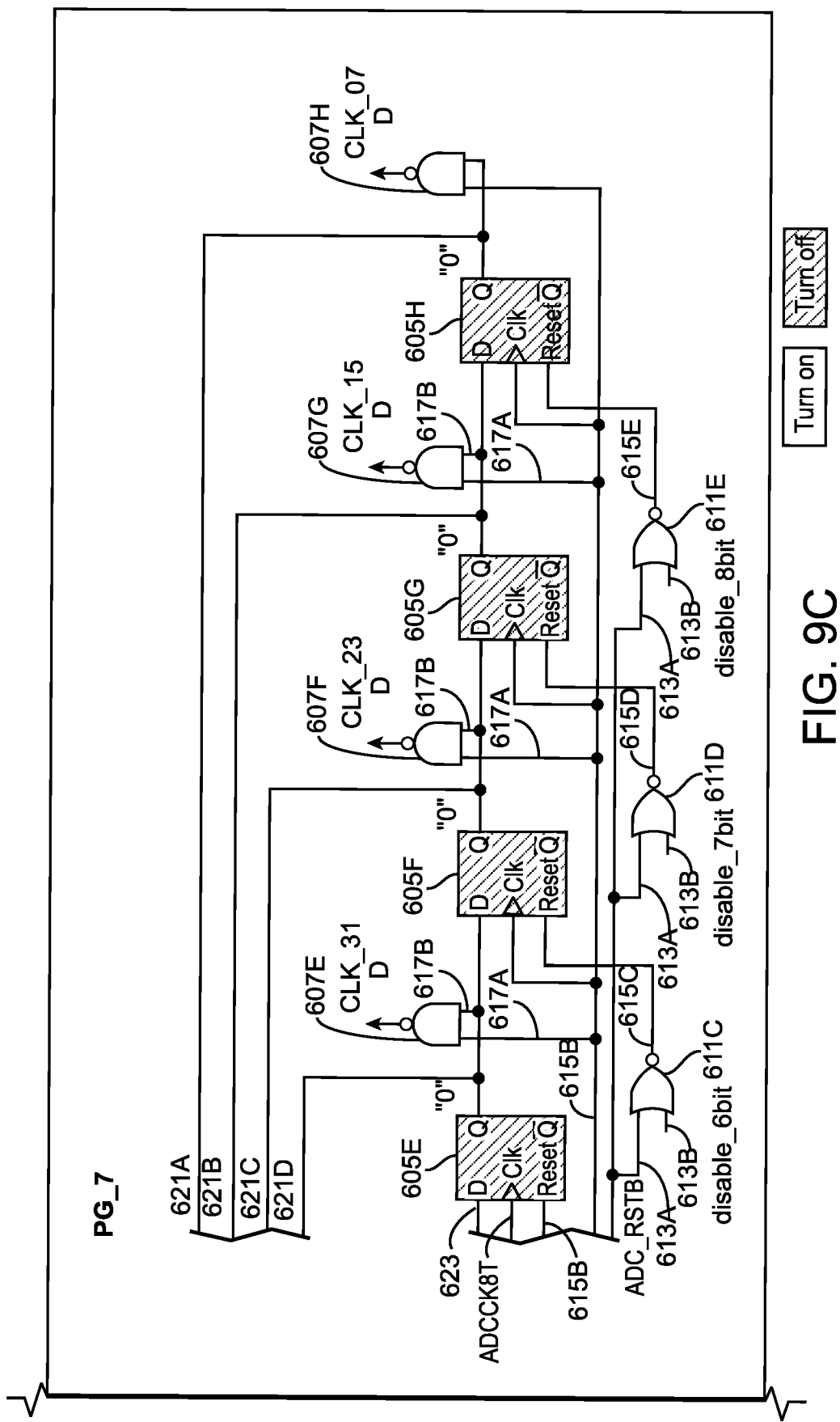
Figure 9D:
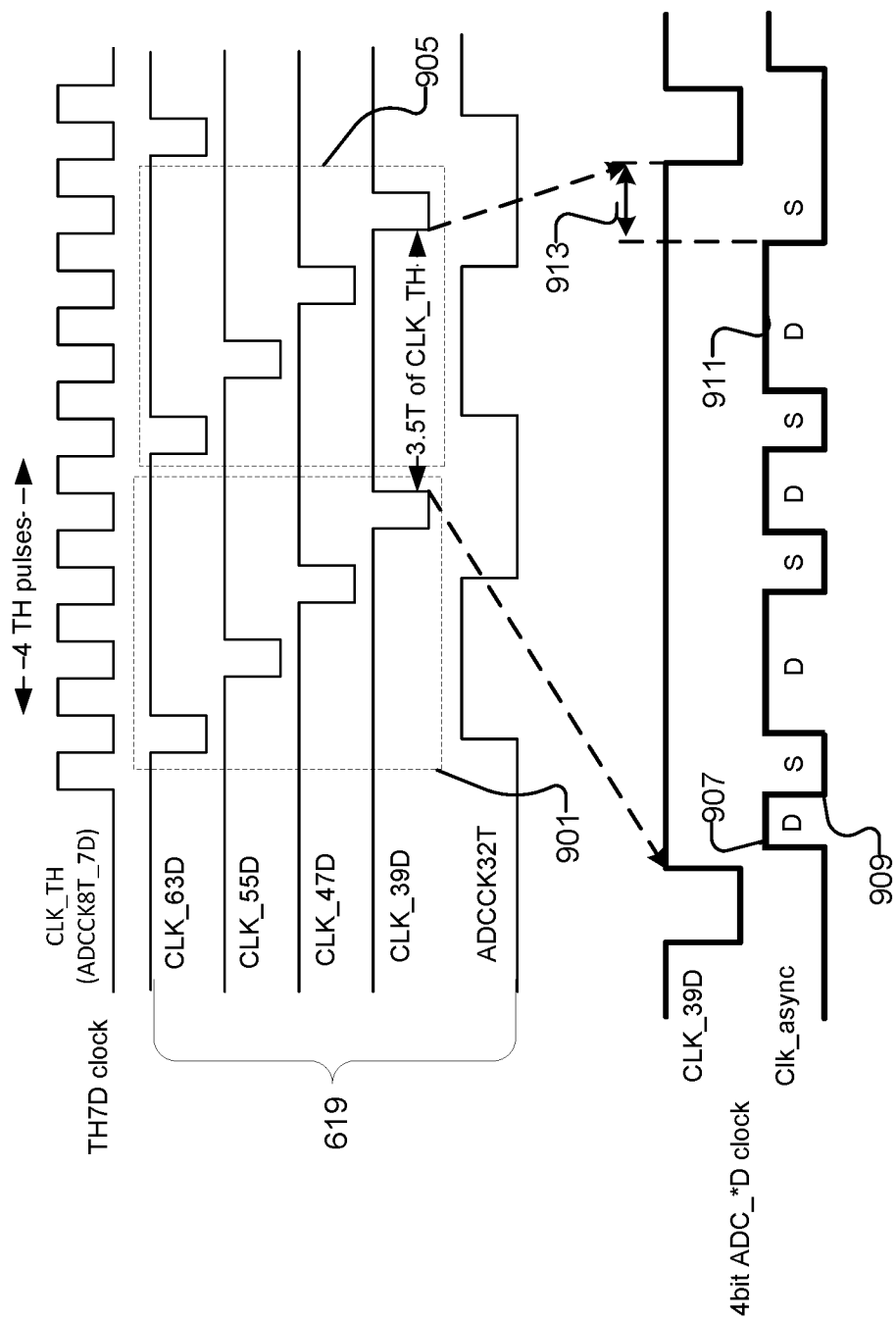
FIG. 9D is a wave form diagram of the receiver in the third insertion loss mode according to an embodiment.

FIGS. 9B and 9C illustrate a detailed view of the pulse generator circuit PG_7 during the SR mode and FIG. 9D illustrates the clock signals generated by the pulse generator circuit PG_7 during the SR mode according to one embodiment. Note that FIG. 9C is a continuation of the pulse generator circuit PG_7 shown in FIG. 9B. During the SR mode of the receiver 100, some of the disable bits are set to a value that disables the generation of the clock signals for the second portion of the SAR slices and some of the disable bits are set to a value enables the generation of the clock signals for the first portion of the SAR ADC slices. For example, during the SR mode of the receiver 100, the disable bits disable_5 bit, disable_6 bit, disable_7 bit and disable_8 bit are set to a value of "1" to disable the first portion of the SAR ADC slices and the remaining disable bit disable_4 bit is set to a value of "0" to enable the second portion of the SAR ADC slices.

By setting the disable bits disable_5 bit, disable_6 bit, disable_7 bit and disable_8 bit to the value of "1", the pulse generator PG_a does not generate the clock signals CLK_31, CLK_23, CLK_15D and CLK_07D. Clock signals CLK_31, CLK_23, CLK_15D and CLK_07D are not generated because the registers 605E to 605H that are responsible for generating the clock signals are reset due to the value of the disable bits disable_5 bit, disable_6 bit, disable_7 bit and disable_8 bit and the reset signal ADC_RSTB causing the NOR gates 611B to 611E to output a value that resets the registers 605E to 605H. By setting the disable bits to "0" for the remaining disable bit disable_4 bit, the pulse generator PG_a generates the clock signal required to enable the associated SAR slices due to the value of "0" and the reset signal ADC_RSTB causing NOR gate 611A to output a value of "0" to the "Reset" input of the registers 605D. The value of "0" input to the "Reset" input of register 605D prevents the registers 605D to 605F from resetting the value stored in the register. As a result of the disable bit disable_4 bit being set to "0" and disable bits disable_5 bit to disable_8 bit being set to "1", pulse generator PG_7 generates clock signals CLK_63D, CLK_55D, CLK_47D, and CLK_39D as shown in FIG. 9D. As shown in FIG. 9C, CLK_31D, CLK_23D, clock signals CLK_15D, and CLK_7D are not generated.

Furthermore, by setting the disable bits disable_5 bit to disable_8 bit to a value of "1" and the remaining disable bit disable_4 bit to a value of "0", the MUX 609 selects subsequent inputs for input (D) for the first register 605A based on the output (D) of register 605D, but not registers 605E to 605H in comparison to the LR and MR modes. As shown in FIG. 9C, the first pulse 901 of the clock signals output by the pulse generator PG_a is separated from the second pulse 905 of the clock signals by 4 pulses of the clock signal CLK_TH in the SR mode compared to 8 pulses in the LR mode and 6 pulses in the MR since only 4 SAR ADC slices are enabled in the SR mode. For example, the first pulse 901 of clock signal CLK_63D is separated by the second pulse 905 by 4 pulses of the clock signal CLK_TH.

To generate the second pulse 905 of the clock signal CLK_63D and for each subsequent pulse of the clock signal CLK_63D, the MUX 609 may select the input (D) for the first register 605A based on the output of the register 605C due to the disable bit disable_4 bit having a value of "0" and the remaining disable bits having a value of "1". The pulse generator PG_a generates the clock signals for the remaining SAR slices in a similar manner.

According to one embodiment, the duration of the pulse width of each clock signal 619 in the SR mode is less than the duration of the pulse width of each clock signal 619 in the LR mode and the MR mode. As shown in FIG. 9D, during the SR mode the duration of the pulse width of each clock signal 619 is 3.5T of the clock signal CLK_TH whereas the duration of the pulse width of each clock signal 619 is 7.5T of the clock signal CLK_TH during the LR mode and 5.5T of the clock signal CLK_TH during the MR mode. As shown in FIG. 9D, while each clock signal for each SAR slice is at a state in which the SAR slice samples the analog input (e.g., a high value such as "1"), the corresponding SAR slice has a plurality of decision times 907 in which the SAR slice determines whether the analog input represents a value of "1" or "0" has a plurality of settling times 909 in which the analog input value can settle before the next decision time 807. Thus, a settling time 909 occurs before each subsequent decision time 907 as shown in FIG. 9C. FIG. 9D illustrates the decision times 907 and settling times 909 that occur in the SAR ADC slice ADC_39D while its clock signal CLK_39D is in the state at which the SAR ADC slice samples the analog input signal.

Similar to the LR mode and MR mode, the total possible number of decision times and the total possible number of settling times is the same and is based on the total number of SAR slices in each sub-ADC_207 that are enabled during the SR mode. In the example herein, each sub-ADC includes a total of 8 SAR slices, but only 4 of the SAR slices are enabled in the SR mode. Thus, the total number of decision times is 4 and the total number of settling times is also 4 in the SR mode in one embodiment.

After the last decision time 911, a timing margin 913 is provided before the clock signal transitions to a state in which the SAR slice stops sampling the analog input (e.g., a low value such as "0"). Similar to the LR mode and MR mode, the timing margin 913 ensures that all of the enabled SAR slices has had sufficient amount of time to make a decision whether the analog input represents a value of "1" or "0" before the clock signal for the SAR slice transitions to the state in which the SAR slice stops sampling the analog input. In one embodiment, the timing margin 913 in the SR mode is the same as the timing margin 713 in the LR mode and the timing margin 813 in the MR mode even though only 4 bits of the analog input are sampled in the SR mode thereby preventing increased dead space between the last decision time 911 and the transition of the clock signal. In alternative embodiments, the timing margins in the different insertion loss modes are different.

Method Flow Diagrams

Figure 10:
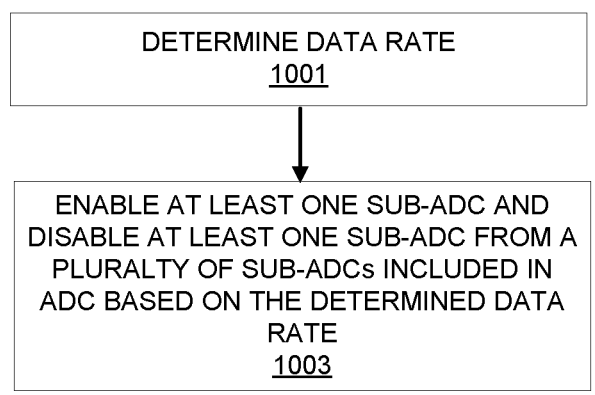
FIG. 10 is a method flow diagram describing a method for reconfiguring the ADC, according to the data rate of the receiver according to an embodiment.

FIG. 10 is a method flow diagram describing how to reconfigure an ADC 120 of the receiver 100 according to one embodiment. Note in other embodiments, other steps may be shown than those illustrated in FIG. 10.

In one embodiment, the receiver 100 determines 1001 a data rate that the receiver 100 will receive data. Based on the determined data rate, the receiver 100 enables 1001 at least one sub-ADC from a plurality of sub-ADCs included in each time-interleaved ADC 120 and disables at least one sub-ADC from the plurality of sub-ADCs included in each time-interleaved ADC 120 of the receiver 100 based on the determined data rate.

Figure 11:
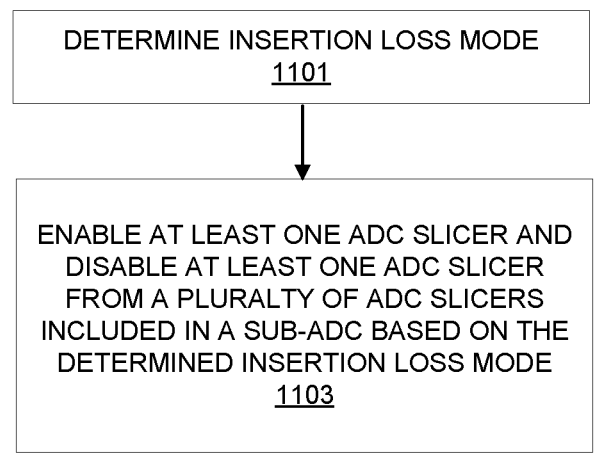
FIG. 11 is a method flow diagram describing a method for reconfiguring the ADC according to the insertion loss mode of the receiver, according to an embodiment

FIG. 11 is a method flow diagram describing how to reconfigure a sub-ADC of ADC 120 of the receiver 100 according to one embodiment. Note in other embodiments, other steps may be shown than those illustrated in FIG. 11.

In one embodiment, the receiver 100 determines 1001 the insertion loss mode of the receiver 100 regardless of the data rate of the receiver 100. Based on the determined insertion loss mode, the receiver 100 enables 1003 at least one ADC slicer and disables at least one ADC slicer from a plurality of ADC slicers included in the sub-ADC 120 based on the determined insertion loss mode. The insertion loss mode does not impact the data rate that the receiver 1001 will receive data.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a receiver having ADCs with an adjustable sampling clock through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A receiver comprising:
    a clock generator including a plurality of clock signal generators that generate a plurality of sampling clock signals having a plurality of sampling phases, each of the plurality of sampling clock signals having a corresponding one of the plurality of sampling phases; and
    a plurality of time-interleaved analog-to-digital converters (ADC) that each sample an analog input signal at a corresponding one of the plurality of sampling phases to convert the analog signal into a digital sample, each of the plurality of time-interleaved ADCs including a plurality of sub-ADCs that sample the analog input signal at a data rate of the receiver;

wherein responsive to the receiver being configured to operate at an insertion loss mode from a plurality of insertion loss modes where the insertion loss mode has an insertion loss that is less than a maximum insertion loss of the receiver, a part of each sub-ADC of the plurality of sub-ADCs of at least one of the plurality of time-interleaved ADCs is enabled to sample the analog input signal at the data rate of the receiver to generate the digital sample and a remaining part of each-sub-ADC of the plurality sub-ADCs of the at least one of the plurality of time-interleaved ADCs is disabled, wherein during the insertion loss mode the receiver is configured to convert the analog signal into the digital sample such that the digital sample has the insertion loss associated with the insertion loss mode.

2. The receiver of claim 1, wherein each of the plurality of sub-ADCs of at least one of the plurality of time-interleaved ADCs includes a plurality of time-interleaved successive approximation (SAR) ADC slices that sample the analog input signal at the data rate of the receiver.

3. The receiver of claim 2, wherein the part of each sub-ADC that is enabled comprises a portion of the plurality of SAR ADC slices included in the sub-ADC and the remaining part of each sub-ADC that is disabled comprises a remaining portion of the plurality of SAR ADC slices included in the sub-ADC.

4. The receiver of claim 3, wherein a total number of the enabled portion of the plurality of SAR ADC slices and a total number of the disabled portion of the plurality of SAR ADC slices are different for each of the plurality of insertion loss modes.

5. The receiver of claim 4, wherein the plurality of insertion loss modes includes a first insurrection loss mode, a second insertion loss mode, and a third insertion loss mode where the third insertion loss has a greatest insertion loss from amongst the first insertion loss, the second insertion loss, and the third insertion loss, wherein the total number of the enabled portion of the plurality of SAR ADC slices in the third insertion loss mode includes all of the plurality of SAR ADC slices included in the at least one of the plurality of sub-ADCs.

6. The receiver of claim 5, wherein the receiver is configured to sample the analog input signal at the data rate regardless of whether the receiver is operating in the first insertion loss mode, the second insertion loss mode, or the third insertion loss mode.

7. The receiver of claim 6, wherein the data rate at which the receiver is configured to sample the analog input data is selectable from a plurality of different data rates.

8. The receiver of claim 5, wherein the third insertion loss is greater than 30 dB, the second insertion loss is in a range of 14 dB to 30 dB, and the first insertion loss is less than 15 dB.

9. The receiver of claim 5, wherein the second insertion loss is less than the third insertion loss and greater than the first insertion loss, wherein the total number of the enabled portion of the plurality of SAR ADC slices in the second insertion loss mode is half of the plurality of SAR ADC slices included in the at least one of the plurality of sub-ADCs and the total number of the disabled portion of the plurality of SAR ADC slices is a remaining half plurality of SAR ADC slices included in the at least one of the plurality of sub-ADCs.

10. The receiver of claim 9, wherein the first insertion loss is less than the second insertion, wherein the total number of the enabled portion of the plurality of SAR ADC slices in the first insertion loss mode includes more than half of the SAR ADC slices included in the at least one of the plurality of sub-ADCs but less than all of the SAR ADC slices included in the at least one of the plurality of sub-ADCs, and the total number of the disabled portion of the plurality of SAR ADC slices includes remaining SAR ADC slices included in the at least one of the plurality of sub-ADCs.

11. The receiver of claim 10, wherein each of the plurality of time-interleaved ADCs includes a plurality of pulse generator circuits, each of the plurality of pulse generator circuits coupled to a corresponding one of the plurality of sub-ADCs included in the plurality of time-interleaved ADCs, wherein each of the plurality of pulse generator circuits is configured to generate a plurality of clock signals that enable the plurality of SAR ADC slices included in the corresponding one of the plurality of sub-ADCs that is coupled to the pulse generator circuit to sample the analog input data.

12. The receiver of claim 11, wherein a pulse generator circuit from the plurality of pulse generator circuits that is coupled to the at least one of the plurality of sub-ADCs enables the enabled portion of the plurality of SAR ADC slices during the third insertion loss mode by generating the plurality of clock signals that enable all of the plurality of SAR ADC slices included in the at least one of the plurality of sub-ADCs.

13. The receiver of claim 11, wherein a pulse generator circuit from the plurality of pulse generator circuits that is coupled to the at least one of the plurality of sub-ADCs enables the enabled portion of the plurality of SAR ADC slices during the second insertion loss mode by generating the plurality of clock signals that enable the half of the plurality of SAR ADC slices included in the at least one of the plurality of sub-ADCs and disables the remaining half of the plurality of SAR ADC slices included in the at least one of the plurality of SAR ADC slices by refraining from generating clock signals for the remaining half of the plurality of SAR ADC slices.

14. The receiver of claim 11, wherein a pulse generator circuit from the plurality of pulse generator circuits that is coupled to the at least one of the plurality of sub-ADCs enables the enabled portion of the plurality of SAR ADC slices during the first insertion loss mode by generating the plurality of clock signals that enable the plurality of SAR ADC slices included in the at least one of the plurality of sub-ADCs and disables the remaining SAR ADC slices included in the at least one of the plurality of SAR ADC slices by refraining from generating clock signals for the remaining SAR ADC slices.

15. A method of a receiver that includes a clock generator and a plurality of time-interleaved analog-to-digital converters (ADC) comprising a plurality of sub-ADCs that sample the analog input signal at a data rate of the receiver, the method comprising:

generating a plurality of sampling clock signals having a plurality of sampling phases, each of the plurality of sampling clock signals having a corresponding one of the plurality of sampling phases; and sampling the analog input signal using each of the plurality of time-interleaved ADCs, the analog input signal sampled by each of the plurality of time-interleaved ADCs at a corresponding one of the plurality of sampling phases to convert the analog signal into a digital sample;

wherein responsive to the receiver being configured to operate at an insertion loss mode from a plurality of insertion loss modes where the insertion loss mode has an insertion loss that is less than a maximum insertion loss of the receiver, enabling a part of each sub-ADC of the plurality of sub-ADCs of at least one of the plurality of time-interleaved ADCs to sample the analog input signal at the data rate of the receiver to generate the digital sample and disabling a remaining part of each sub-ADC of the plurality sub-ADCs of the at least one of the plurality of time-interleaved ADCs, wherein during the insertion loss mode the receiver is configured to convert the analog signal into the digital sample such that the digital sample has the insertion loss associated with the insertion loss mode.

16. The method of claim 15, wherein each of the plurality of sub-ADCs of at least one of the plurality of time-interleaved ADCs includes a plurality of time-interleaved successive approximation (SAR) ADC slices that sample the analog input signal at the data rate of the receiver, wherein enabling the part of each sub-ADC comprises enabling a portion of the plurality of SAR ADC slices included in the sub-ADC, and wherein disabling the remaining part of each sub-ADC comprises disabling a remaining portion of the plurality of SAR ADC slices included in the sub-ADC.

17. The method of claim 16, wherein a total number of the plurality of SAR ADC slices that are enabled and a total number of the plurality of SAR ADC slices that are disabled are different for each of the plurality of insertion loss modes.

18. The method of claim 17, wherein the plurality of insertion loss modes includes a first insurrection loss mode, a second insertion loss mode, and a third insertion loss mode where the third insertion loss has a greatest insertion loss from amongst the first insertion loss, the second insertion loss, and the third insertion loss, wherein the total number of the enabled portion of the plurality of SAR ADC slices in the third insertion loss mode includes all of the plurality of SAR ADC slices included in the at least one of the plurality of sub-ADCs.

19. The method of claim 18, wherein the second insertion loss is less than the third insertion loss and greater than the first insertion loss, wherein the total number of the enabled portion of the plurality of SAR ADC slices in the second insertion loss mode is half of the plurality of SAR ADC slices included in the at least one of the plurality of sub-ADCs and the total number of the disabled portion of the plurality of SAR ADC slices is a remaining half the plurality of SAR ADC slices included in the at least one of the plurality of sub-ADCs.

20. The method of claim 19, wherein the first insertion loss is less than the second insertion, wherein the total number of the enabled portion of the plurality of SAR ADC slices in the first insertion loss mode includes more than half of the SAR ADC slices included in the at least one of the plurality of sub-ADCs but less than all of the SAR ADC slices included in the at least one of the plurality of sub-ADCs, and the total number of the disabled portion of the plurality of SAR ADC slices includes remaining SAR ADC slices included in the at least one of the plurality of sub-ADCs.

* * * * *